United States Patent [19]

Bentley et al.

[11] Patent Number: 5,210,760
[45] Date of Patent: May 11, 1993

[54] OPTIMIZED POINTER CONTROL SYSTEM

[75] Inventors: Steven R. Bentley, Tucson, Ariz.; Gary W. Callsen, Centreville, Va.; James M. Karp; Stephen C. West, both of Tucson, Ariz.

[73] Assignee: International Business Machines Corporation, Armonk, N.Y.

[21] Appl. No.: 657,223

[22] Filed: Feb. 15, 1991

[51] Int. Cl.⁵ .......................................... H03M 13/00
[52] U.S. Cl. .................................. 371/38.1; 371/40.3
[58] Field of Search ...................... 371/5.4, 38.1, 39.1, 371/44, 40.3, 40.1, 42

[56] References Cited

U.S. PATENT DOCUMENTS 5,109,385  4/1992  Karp et al. ........................ 371/40.1
5,136,592  8/1992  Weng ................................ 371/38.1

Primary Examiner—Vincent P. Canney
Attorney, Agent, or Firm—Greenlee & Winner

[57] ABSTRACT

Pointer control logic for error correcting codes includes a set of registers the contents of which are rotated whenever data from a track with a pointer are processed. In that manner, a given one register always contains pointer data for the track under consideration (if that track has a pointer). The pointer control logic includes programmable initializing values to stress write operations as desired. Further, the logic contains multiple and programmable pointer dropping thresholds so that pointer registers can be candidates for dropping dependent on the type of error encountered. Provision is made for extending pointer life when errors are encountered, registers are full, and no register has dropped below the pointer dropping threshold.

28 Claims, 11 Drawing Sheets

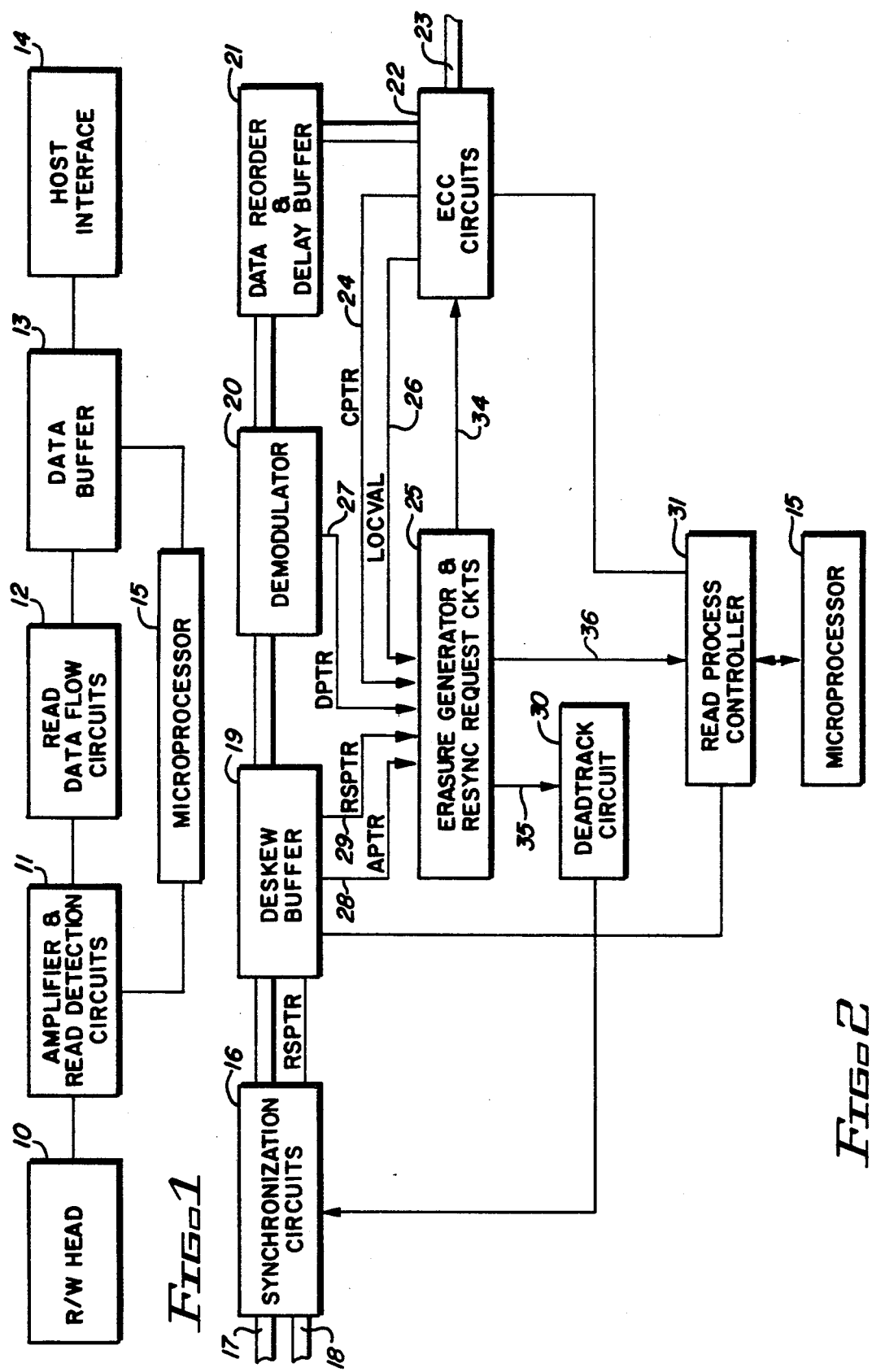

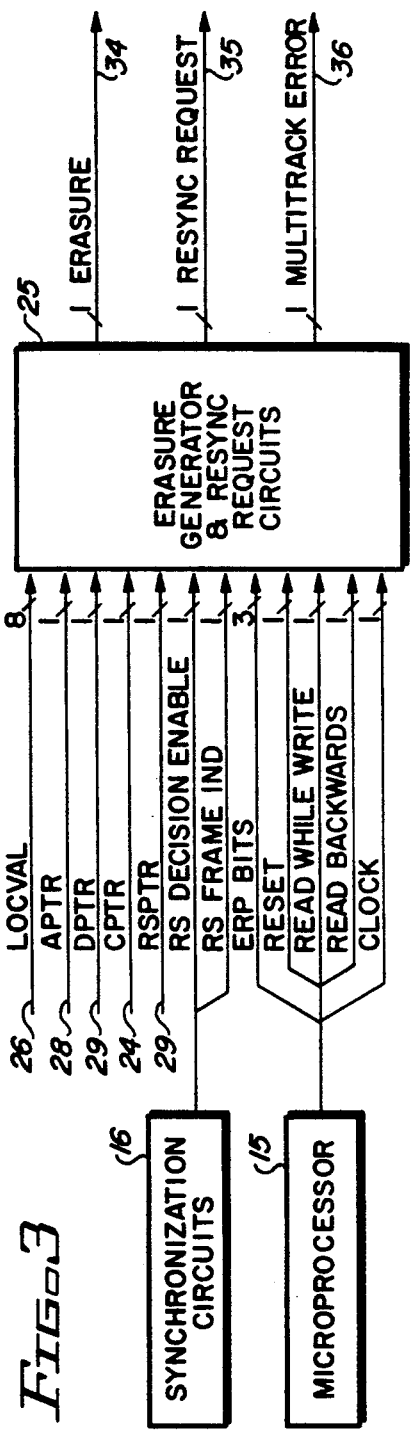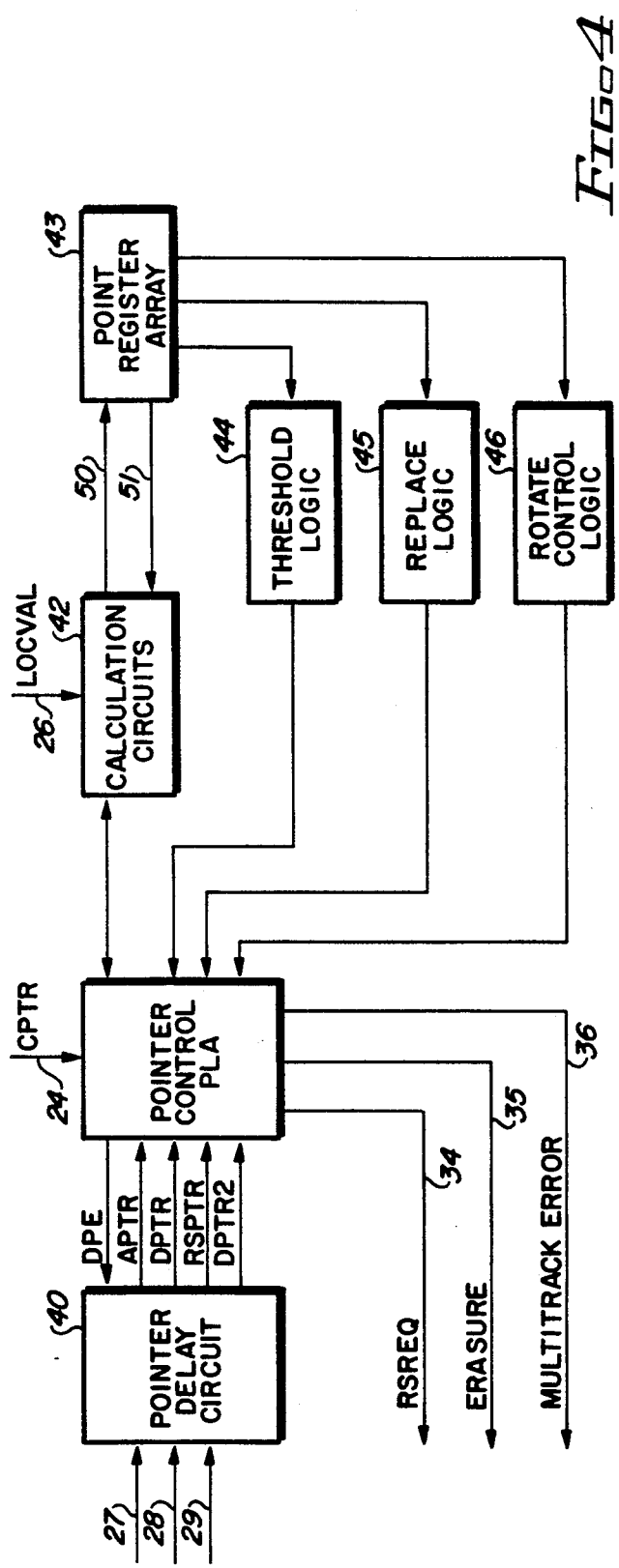

OPTIMIZED POINTER CONTROL SYSTEM

This invention relates to data processing systems and, more particularly, to improvements in error correction code systems and procedures.

BACKGROUND OF THE INVENTION

In data processing systems, data is stored in a variety of devices, such as, for example, main memory, magnetic disk, magnetic tape, optical disk, etc. Whatever the storage medium, it is essential that the data be correctly written on the medium and correctly retrieved. Although the degree of reliability provided by storage devices is high, there will be failures influencing the accuracy of information stored or read from time to time. As a consequence, error detection and correction techniques have been developed and have been in use for many years. The theory of redundant storage techniques and devices practicing those techniques are based upon error correcting codes, such as described in ERROR CORRECTING CODES, Second Edition, W. W. Peterson and E. J. Weldon, Jr. the MIT PRESS 1972, and Richard E. Blahut THEORY AND PRACTICE OF ERROR CONTROL CODES, Addison Wesley, Redding, Mass. 1983.

In the various error correcting codes, the ability to detect and correct errors is increased when the code module receives a pointer to particular data that is in error, or suspected to be in error. Essentially, the power of the error detection and correction code circuitry is doubled when a pointer to an error is provided. The invention to be described herein relates to an improved technique for the generation and processing of such pointers. The invention is useful regardless of the technology in which error correcting code techniques are utilized and it is beneficial to all codes. For example, the invention is useful in correcting errors on magnetic disk or tape, optical disk or tape, or any other type of transmitting device employing error correction.

SUMMARY OF THE INVENTION

Error correcting techniques requiring redundant transmission are limited in their power to correct errors by the amount of redundancy provided. When the number of errors exceeds the redundancy, the error correcting capability is lost. This invention sets a threshold for pointing to tracks or channels which have experienced errors so that if the number of error free transmissions since a detected error is greater than the threshold, the track or channel pointer becomes a candidate for dropping even though the number of error free transmissions has not been great enough to automatically drop the pointer. Further, the invention sets multiple dropping thresholds, dependent on the type of error detected and makes these thresholds programmable to allow for optimization.

The invention also sets initializing values for the retention of pointers at different levels dependent on the type of process in operation. The initializing values used in a read-while-write operation result in an extension of pointer life over those initial values used in a read only operation. In this manner, the write operation is held to a higher standard, thus leaving margin for future read operations.

In a particular implementation, a rotating register circuit is used to contain pointer information. Only that number of registers needed to point to active errors is used, with pointer information shifted from register to register so that a given one register always contains pointer information on the track under consideration. In that manner, incrementing/decrementing counters are connected to only one register thereby saving circuit expense.

BRIEF DESCRIPTION OF THE DRAWINGS

FIG. 1 is a block diagram of a read operation in a data processing system utilizing the instant invention.

FIG. 2 is a more detailed block diagram of the read data flow circuits shown in FIG. 1.

FIG. 3 is a diagram showing the input and output signals for the erasure generator and resync request circuits shown in FIG. 2.

FIG. 4 is a block diagram showing further details of the erasure generator and resync request circuit.

DETAILED DESCRIPTION OF THE PREFERRED EMBODIMENT

Figure 5:
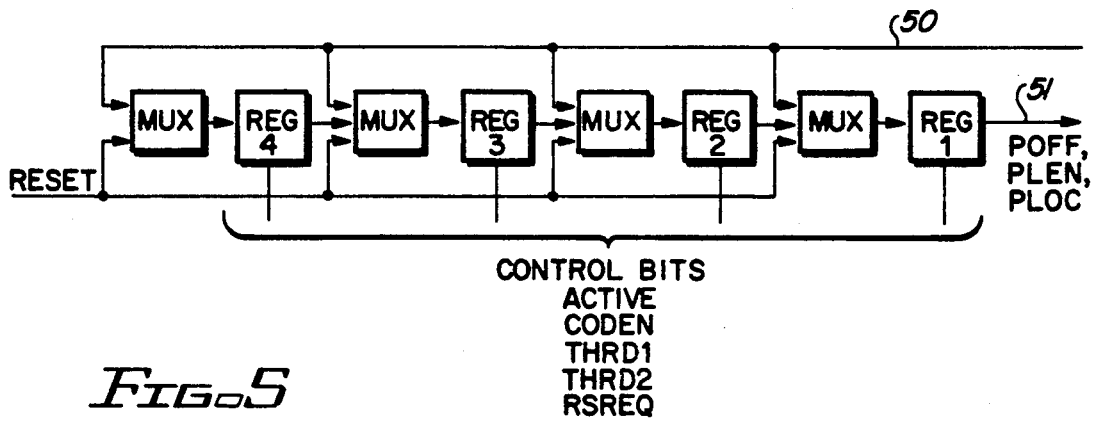
FIG. 5 shows the rotating register array implementation of the instant invention.

While the present invention will hereinafter be described in connection with a preferred embodiment and method of use, it will be understood that it is not intended to be limited to that embodiment or that particular method of use. Rather, it is intended to cover all alternatives, modifications and equivalents as may be included within the spirit and scope of the invention as defined by the appended claims.

For a general understanding of the features in the present invention, reference is made to the drawings. In the drawings, like reference numerals have been used throughout to identify similar elements.

FIG. 1 shows read circuits implementing an embodiment of the invention within the framework of a magnetic tape product. In such a product, a read/write head 10 is placed adjacent to the surface of magnetic tape so that data can be written to and read from the tape. In a particular product, 18 such read/write heads are used to write and read 18 tracks of data simultaneously. In FIG. 1, 18 tracks of data read from the tape are transferred from the head mechanism 10 into an amplifier and read detection circuit 11. For purposes of the current invention, one of the important functions performed by the circuits 11 are to inspect the level of the analog signal received from the read/write head. If that signal reaches a certain threshold, it is assumed that the data has been read correctly. However, if the analog signal does not reach that certain threshold, there may be an error present. In such a case, an analog pointer (APTR) is generated by the circuits 11 to point to that data location. Eventually, that pointer will be passed to the read data flow circuits 12 so that the data may be inspected to see if an actual error is present. It should be noted that errors may not be present even if the threshold is not reached since the data may still have been correctly read. Nevertheless, by passing the pointer to the read data flow circuits, the ability of the error correction code to correct errors is optimized. If the data was actually in error and the error correcting portion of the read data flow circuits received no pointer, then those circuits would have to generate both the location and the magnitude of correction needed for that particular error. When the location of the error can be pointed to, for example, by the analog pointer, the job left to the error correction circuits is just to determine the magnitude of the error. As a consequence, when error locations are known, the error correcting circuits can handle twice as many error conditions as they can when the location of errors is unknown.

The output of the amplifier and read detection circuits 11, data signals as well as analog pointer signals, are passed to the read data flow circuits 12. The read data flow circuits include the error correction module (ECC) and also the pointer generation module, that is, erasure generation module. The terms erasure and pointer are essentially synonymous as used herein; an erasure signal being the signal that indicates the presence of an error that has a pointer signal. Consequently, pointer signals are input signals to the erasure generation module while the erasure signal is the output signal to the ECC module. Finally, corrected data from the read data flow circuits is passed to the data buffer 13 and then to the host interface 14. The entire read process is under the supervision of a microprocessor 15.

FIG. 2 shows a detailed description of the read data flow circuits 12. As previously mentioned, data is received from 18 tracks and passed into synchronization circuit 16 over bus 17. Any analog pointers (APTR) that have been generated in the amplifier and read detection circuits 11 are multiplexed with the data and also passed therewith into the synchronization circuits 16. The circuits 11 also generate 18 clock pulses, one for each track, and those clocks are sent to the synchronization circuits 16 over bus 18.

One of the main functions of the synchronization circuits 16 is to scan for a beginning mark on each of the tracks; that is, some special pattern of data which indicates the beginning of a formatted data block. Such a mark might be, for example, two resynchronization frames back-to-back. By a frame is meant a byte of data from each of the tracks wherein each byte begins on a byte boundary. For example, frame one would contain byte one of data from each of the 18 tracks. The synchronization circuits also perform the function of resynchronizing a track that has lost synchronization. By a resynchronization frame is meant a special pattern of bits that does not represent data to be passed back to the host but rather is a marker which occurs periodically in the data through which a track may be synchronized. In a particular embodiment, resynchronization frames are written once every 72 frames.

The synchronization circuits also produce the resync pointer (RSPTR). The resync pointer is generated whenever the resync frame contains an error.

The deskew buffer 19 performs the function of lining up data from each track such that the output is on byte boundaries. This data is passed to the demodulator 20 for inspection of the data for invalid data codes. At this time, it should be noted that when data is written to the tape in a particular embodiment, it is written in a special symbolized format in which a nine-bit symbol is written for each eight bits of data. The nine-bit symbols must then be translated by the demodulator back into the eight data bits that are represented by the symbol. If, in inspecting the symbol the demodulator ascertains that an invalid bit condition exists in the data that has been read, a demodulator pointer (DPTR) is generated. Such a pointer might be the result, for example, of four zero-bits of data in a row within the nine-bit symbol where the rules for creating the symbol state that no more than three zero bits can be written in succession. When such a demodulater error occurs, there is a certainty that an error exists in the data. This is unlike the analog error (A pointer or APTR) discussed previously where the data may have been read correctly but requires an inspection because the data may contain an error. In the case of a demodulator pointer (D pointer or DPTR), the pointer is to data that is definitely in error and must be corrected by the ECC module 22. Data from the demodulator 20 is sent to a data reorder and delay buffer 21 and from there to the ECC module 22. The function of the delay buffer 21 is to allow pointer signals to "stretch out" over a two or three-frame period for purposes to be described later. The purpose of data reordering is for a specific implementation wherein data is sent to more than one type of error correction module and where at least one of the modules requires a specific order in the data. For example, in a product containing an adaptive-cross parity (AXP) error correction code module and a Reed-Solomon error correction code module the product is able to read tapes which have been written with either type of ECC code. In such an implementation, in order to minimize the number of circuits needed to process data for both modules, data reordering is performed in circuits 21.

Corrected data from module 22 is sent over bus 23 to the data buffer 13 shown in FIG. 1. The ECC module 22 also generates a pointer signal when an actual error has been found and corrected. That pointer, called a code pointer (CPTR), is passed over line 24 to the erasure generator and resync request circuits module 25. The location value currently being processed by the ECC module 22 is sent to the erasure generator module 25 over line 26. Other inputs to the erasure generator module include the demodulator pointer (DPTR) signal 27, the APTR signal 28 and the RS pointer signal 29.

When the code pointer input to module 25 indicates that a very large number of errors are occurring on the same track, frame after frame, the erasure module 25 generates a signal which indicates that the track has probably lost synchronization and, therefore, should be "dead tracked." That signal is sent to the dead-track circuit 30 and to the synchronization circuits 16. In that manner the synchronization circuits are alerted to look for the resynchronization frame on that particular track and attempt to reobtain synchronization.

The entire read process is under control of the read process controller 31 which, in turn, is under control of the microprocessor 32. In any error correction scheme, only a certain number of errors can be corrected at any one time. In the 18 track format utilized in a specific product, 14 of those tracks are data tracks while the other four tracks are redundant tracks used for error recovery. If four tracks contain errors and all of the tracks with errors have been pointed to, then the error correction circuits 22 can correct errors on all four of the tracks. If no errors are pointed to, the error correction code circuits 22 can correct errors on only two tracks. When the ability to correct errors is exceeded, a multitrack error signal is generated by the erasure generator module 25 and is sent over line 36 to the read process controller 31. This signals the institution of error recovery procedures (ERP) through which the microprocessor 15 begins a specialized set of procedures in an attempt to reread the data utilizing various altered parameters in an attempt to get past the problem area successfully. That is, an attempt is made to successfully read the data even though a multitrack error situation exists. This invention does not specifically relate to error recovery processes and, therefore, those processes will not be described in detail herein but this invention, making various parameters programmable, enables an expanded menu of passible error recovery procedures. Finally, it should be noted that the erasure generator module 25 produces an output signal 34 which is sent to the ECC module 22. The signal on line 34 is the pointer to specific data that may be in error and it is the raising of the signal on line 34 that alerts the ECC module to the location of the potential error. Note that it is a potential error in the case of an analog pointer, but it is a real or extended error in the case of the D pointer, C pointer or RS pointer.

FIG. 3 shows the input and output signals associated with the erasure generator and resync request circuits 25. The location value is an eight-bit signal which is received from the ECC module 22. This input provides the track identification for the particular data byte being operated upon at that time by the ECC module. The analog pointer, demodulator pointer, code pointer, and resync pointer are signals that have been previously described with reference to FIG. 2. The resync frame indicator signal is a bit that is set periodically each time the synchronization circuits sense a resynchronization frame. In a particular implementation, one of these special symbols occurs every 72 frames on each of the tracks. Consequently, the resync frame indicator flag will be raised for a particular track once each 72 frames. The resync decision enable signal is a bit that is raised at some time prior to the 72nd frame at a time when a decision must be made as to whether that particular track has so many errors that it needs to be resynchronized. The resync decision enable flag may be raised, for example, on the 54th frame and enables the synchronization circuits to look for the synchronization frame. In a particular implementation, the resync decision enable signal, resync frame indicator signal, the error recovery bit signals together with the reset signal, the read-while-write signal, the read backward signal, and the clock signal may all be received from the read process controller 31 shown in FIG. 2. The output signals provided from the erasure generator 25 include the erasure signal which is provided over line 34 to the ECC circuit 22; the resync request signal which is provided over line 35, in order to dead track a particular track; and the multitrack error signal is provided over line 36 to the read process controller 31.

FIG. 4 shows the elements included within the erasure generator module 25. Pointer delay circuit 40 receives the A pointer, D pointer and RS pointer as previously described. The function of the pointer delay circuit is to generate frame delays for these pointers to stretch them out over a period of two or three frames. Outputs of the pointer delay circuit include the A pointer, D pointer and RS pointers stretched out over a period of three frames and a D pointer signal (DPTR2) two frames after the initial D pointer input on line 27. These pointer signals are input to the pointer control PLA 41. The code pointer is also input to the programmable logic array (PLA 41) over line 24. PLA 41 exercises the pointer control logic shown in the accompanying flowcharts. Output signals from PLA 41 are sent to the calculation circuits 42 and into a pointer register array 43. Special threshold logic circuits 44, replace logic circuits 45, and rotate control logic circuits 46 receive outputs from the pointer register array and provide signals back to the PLA 41. The outputs of the erasure generator each have already been described, that is, the resync request signal on line 35, the erasure pointer signal on line 34, and the multitrack error signal on line 36. The delay pointer enable (DPE) signal is an output signal of the PLA 41 to stretch out the pointer signals over two or three frames. That is done to improve performance as will be described later herein.

The pointer register array 43 is shown in detail in FIG. 5. Each of the registers receive input from the calculation circuits over line 50 and provide an output on line 51 back to the calculation circuits 42. Control bits are also set in these registers and are provided to the threshold logic, replace logic and the rotate control logic, as well as back to the pointer control PLA 41. The manner of operation of the registers will be explained in more detail after a consideration of the pointer control procedure. Basically, however, the circuit is designed to contain the first pointer received, for example, an A pointer relating to a specific location value, i.e., track, in register 1. If that pointer is still active when the second error is detected, the second pointer, together with that track identification, will be placed in register 2 but will be rotated into register 1 when data from that track is again under consideration. When a third pointer (erasure) is received, and the first two pointers are still active, the third pointer goes in register 3 and, finally, the fourth pointer will go in register 4. Again, the registers are rotated so that register 1 always contains the pointer to the track under consideration. No more than four registers are required in the implementation herein described, since the extent of the redundancy provided in this particular embodiment is four out of the 18 tracks. If there had been additional redundancy built into the system, then there would be additional registers to hold information relating to those additional pointers.

Note that these registers can be set as the result of any one of the four different kinds of pointers. That is, a register can be set to show an analog pointer, a code pointer, a demodulator pointer, or a resync pointer. Note also that the pointers will be held in these registers in the order in which the tracks are processed. Therefore, if track one contains an error, that pointer is placed in register 1. A pointer for a subsequent track, for example, track five, will be in register 2, a pointer for a subsequent track, for example, track 16 will be in register 3, and register 4 would contain a pointer, for example, for track 17. In the rotating scheme provided in this implementation, once data for the frame under consideration for track one has been processed, the pointer information in register 1 corresponding to track one will be shifted into register 4 and each of the other tracks will be moved up by one register. As a consequence, the pointer for a track currently being processed will always be located in register 1. That is, when track 16 is being processed, a pointer for that track will be in register 1. Once processed, that pointer will be transferred back to register 4. Obviously, the pointer would stay in register 1 if there is only one currently active pointer. By utilizing this rotating register technique, the adding or the deleting of registers as needed eliminates the overhead of keeping track of a specific number of registers which are always in place although there may be less than four pointers at any particular time in the processing. In this rotating register technique, if there is only one error there is only one register used, consequently no other overhead is needed. If there are two active pointers, then only two registers are used, and by rotating the contents of the register each time a track completes processing, register 1 always contains the pointer for the next track known to have been in error. Similarly, if there are three active pointers, then only three registers are used. In this manner, an expanding and contracting circle of registers meets the needs of the system and minimizes overhead.

As mentioned above, a delete function is provided to delete pointers when the track has been error free for a certain period. When that certain period, which is programmable, has elapsed, then the register for that pointer is deleted from the circle of registers as the pointer is no longer needed.

As will be detailed in the procedure explained below, pointers cannot be replaced for a certain period of time once they are established and they are automatically deleted after the certain time period mentioned above. But, between these two times, there is an additional time period when the pointer is a candidate for replacement. Such candidates are selected and replaced on the basis of having the smallest time remaining before automatic replacement. The replacement candidates are utilized, for example, if an error occurs on a fifth track. If, however, an error occurs on a fifth track and none of the four pointers have fallen below the threshold in which a register can be replaced, the error on the fifth track may be stored for up to two frames through the pointer delay circuit 40 shown in FIG. 4. If one of the registers drops below the replacement threshold during those two frames then that register will be replaced by the error pointing to the fifth track.

The thresholding values for dropping pointers are programmable. That is, they are under control of the microcode so that they can be changed under various conditions during error recovery procedures.

In inspecting raw data for errors, one of the evaluations customarily made is whether there has been a previous error on that particular track. Previous errors frequently indicate that the raw data currently being inspected will also be in error. However, there are many conditions which create errors and many types of errors result. For example, errors can be of short length but repeated at interspersed intervals; or errors can be wide over more than one track. To optimize the pointer off (POFF) counter for a specific head, media, channel system, the current invention provides a programmable POFF count. When an error is encountered, the count in the register is initialized according to the optimum value. Another example of a programmed pointer parameter is the "pointer dropping" threshold. These parameters are intended as a designation of the quality of the pointer. That is, is it necessary to continue pointing at this particular track as being potentially in error. The idea is that while pointers normally stay on until the pointer off variable expires, there are times when numerous errors are being pointed to and the number of tracks in error exceed four. At that time, it is desirable to know what the quality of the pointer is, is it likely to be actually pointing to a track that will be in error or can it be dropped in order to free up pointer space to point to tracks which are more likely to be in error. It is important to drop pointers under the multiple error condition where the pointer is not needed, since the power of the error correcting code is limited to four erasures.

Figure 6:
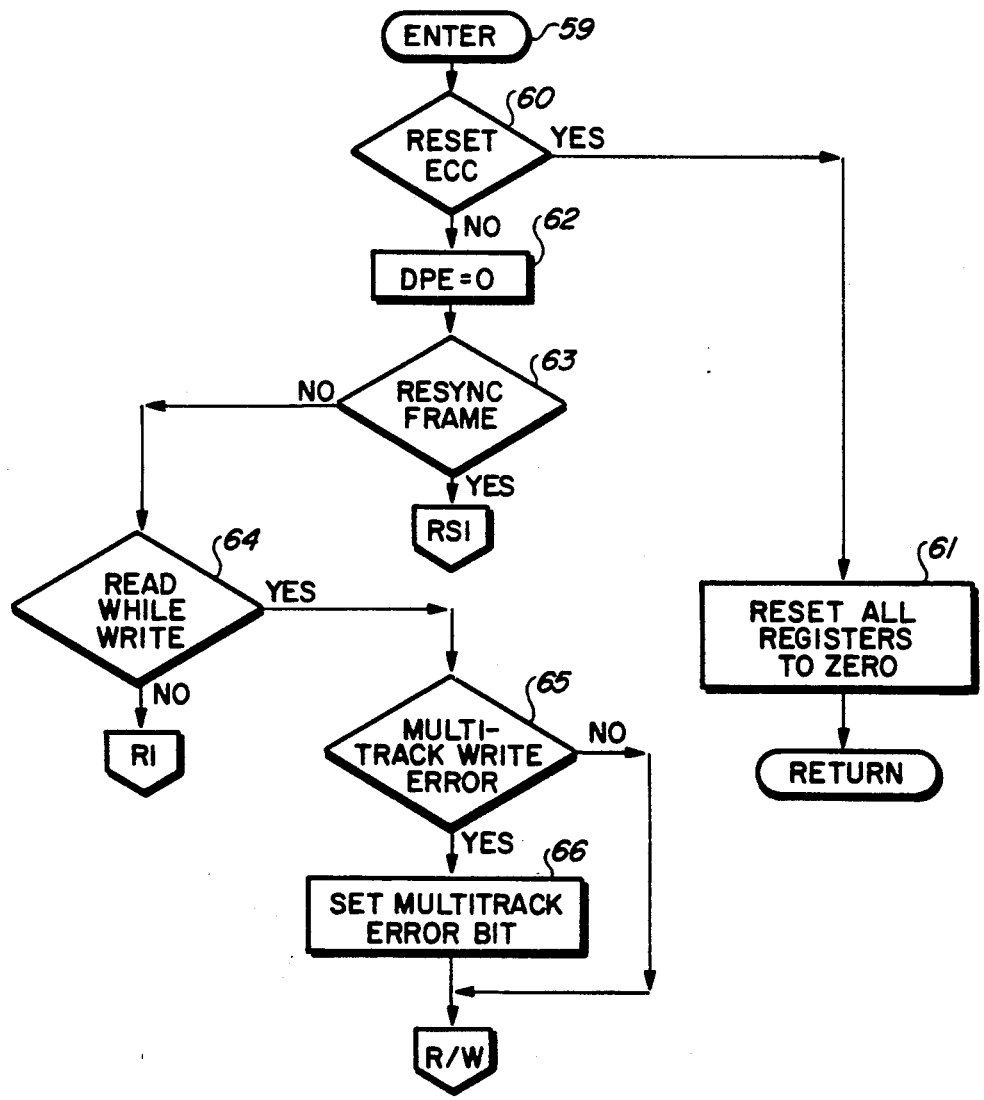
FIG. 6 is the basic control process for the generation of erasures according to the instant invention.

FIG. 6 shows the pointer control process that is entered at step 59 on each clock cycle. Again, this process is exercised in PLA 41 in order to provide appropriate erasure indicators. As stated above, the synchronization circuits look for a special mark which identifies the beginning of formatted data. When that special mark is sensed at step 60, a new block of formatted data is about to be read. At that time, all of the pointer registers shown in FIG. 5 are reset to zero at step 61 and a return is made to step 59 to await the next clock cycle. On the next clock cycle, the delay pointer enable signal is set to zero at step 62 and a determination is made whether the current frame is a resynchronization frame at step 63. If it is, the resynchronous frame processing procedure is performed while if it is not, a branch is made to step 64 to determine whether we are in read-while-write mode. If a read-while-write operation is not underway, the read-only frame processing procedure is performed. If the read-while-write mode is in operation, a check is made to determine whether a multitrack error has been sensed at step 65, and if so, the multitrack error bit is set at step 66. A branch is then made to the read-while-write data frame processing procedure.

Figure 7:
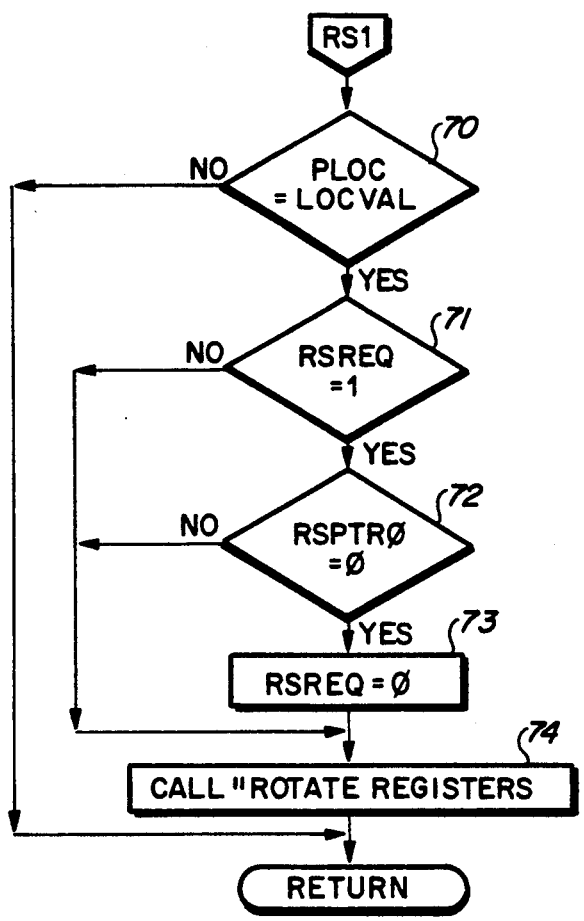
FIG. 7 shows the control technique for processing synchronizing frames.

In this particular implementation, a resynchronizing frame occurs once every 72 frames on each track. If such a frame is currently being processed, a branch is made from step 63 to step 70 shown on FIG. 7. At step 70, a current track ID, that is, location value (LOCVAL), is compared with the track ID of the pointer (PLOC) located in register 1. If there is no match, then there is no pointer to the track currently under consideration, and a branch is made back to step 59 on FIG. 6 to await the next clock cycle. If, however, there was a pointer raised for the current track, a query is made at step 71 as to whether a resync request has been made for that track. If there is no need to resynchronize the track, the registers are rotated and a return is made to step 59 on FIG. 6. If, however, there is a need to resynchronize the track, that is, the track has been "dead tracked" then a branch is made to step 72 to ascertain whether the resync pointer has been raised. If the resync pointer has been raised, this indicates that there is a problem in reading the resync frame. In such case, it will not be possible to resynchronize the track on the particular resync frame now under consideration. Therefore, the pointer is maintained and a branch is made to rotate the registers and return to step 59. If the resync pointer has not been raised, then the resynchronization frame has been accurately read in which case the track will once again be synchronized, the resync request bit is set to zero at step 73, the registers rotated at step 74, and a return made to step 59.

Returning now to FIG. 6, suppose that a branch is taken at step 63 to ascertain whether the process is in a read-while-write mode. In this mode, during the write process, the data which has just been written is immediately read back to determine whether or not it was written properly. Thus, a read-while-write operation is a read-back operation of what has just been written. If that kind of operation is taking place, a branch is made at step 64 to step 65 to determine whether a multitrack write error has been detected. The multitrack write error signal is raised whenever the criteria for the number of tracks that can be in error is exceeded. For a read operation, as previously discussed, there is the capability of correcting errors as long as there are no more than four tracks in error at any one time. In a read-while-write operation, the criteria is reduced to two tracks since if there are more than two tracks in error, there is good reason to stop the process, go back and write the data again. It is desirable to be as accurate as possible in writing data in order to provide as much error correcting capability as possible in the subsequent read-only operations where the data is being retrieved and cannot be rewritten. Therefore, if the multitrack write criteria has been exceeded, a branch is taken at step 65 to step 66 to set the multitrack error bit. Thereafter a branch is taken to the read-while-write data frame procedure shown on FIG. 8.

Figure 8:
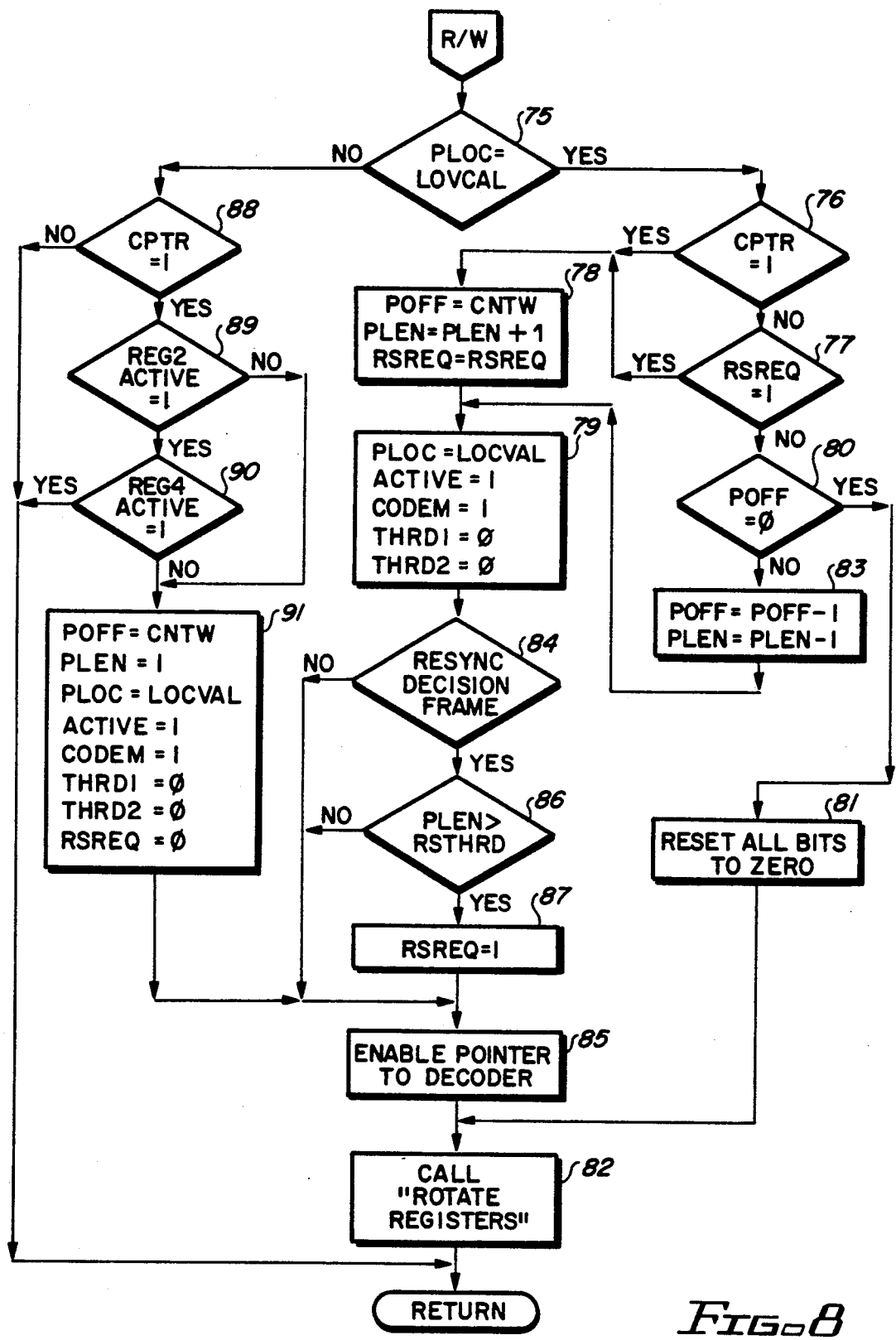
FIG. 8 shows the control technique for processing erasure generation during a read while write process.

In FIG. 8, the first determination is whether the location value, that is the identification of the track currently under consideration by the error correction code module, is already pointed to. If it is, then the value of the pointer in register 1 is equal to the location value and a branch is taken to step 76. If at step 76 it is found that a code pointer is currently raised for that track, or at step 77, that a resync request has been issued for that track, in either case, a branch is taken to step 78. At step 78, the pointer off value (POFF) is initialized to the initial value (CNTW) for a read-while-write operation by placing that value in the appropriate location in register 1. In addition, the count in the pointer length register (PLEN) is increased by one in register 1, and the value of the resynchronization request bit is continued at whatever its current value is.

The pointer off variable set in step 78 for the read-while-write operation is programmable, that is, it is under microcode control. The read process controller 31, shown in FIG. 2, contains programmable control registers which are set by the microprocessor 15. The CNTW value in those registers is transmitted to the erasure generator PLA 41 and from there, the value is set in the pointer register array 43. Therefore, each time a read-while-write operation is entered and a code pointer is set for that frame, the pointer off count is reinitialized. To state it another way, a real error has been detected and corrected in the error correcting code module. Since there was a real error on that frame, the pointer off variable is set to its initial value and the pointer length count is incremented by one. The pointer length count (PLEN) is a measure of the quality of the track currently being considered. It is a variable that is initialized to zero and increased each time that a code error is present (or resync request signal is present) for that particular frame and decremented when they are not present as shown in step 83, explained below.

Next, at step 79, the various control bits are set, that is, since there is an active pointer, the active bit is set to one. Since a code pointer is present, the code or demodulator pointer bit flag (CODEM) is set to one, and the threshold bits are both set to zero. The importance of the threshold bits will be discussed later herein with respect to read-only mode.

Figure 15:
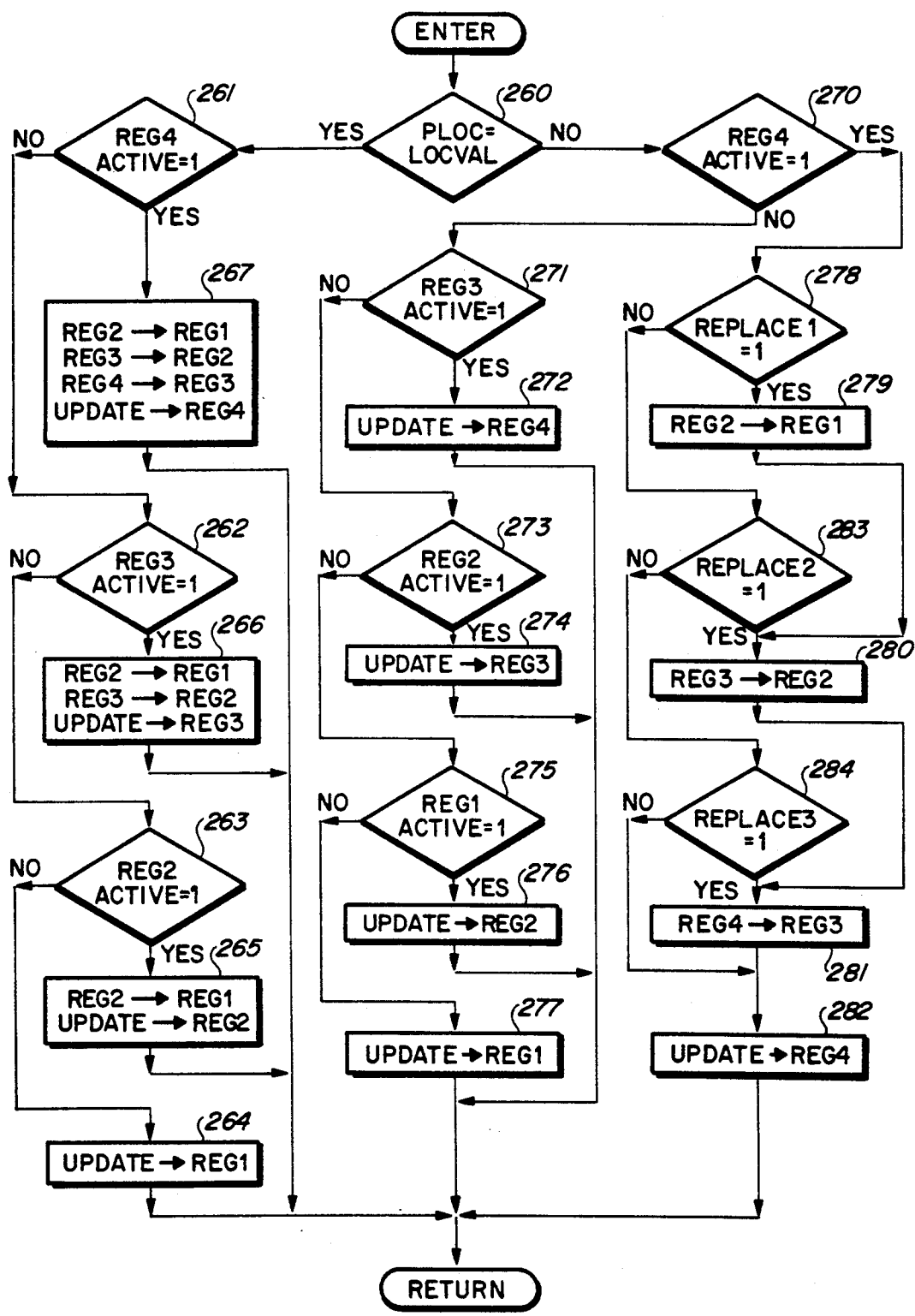
FIG. 15 shows the procedure for updating registers in the rotation register circuit of FIG. 5.

Returning to steps 76 and 77, suppose that neither a code pointer nor a resync request bit was set, in such case, a branch is taken to step 80 for a determination of whether the pointer off count (POFF) is equal to zero. If it is equal to zero, it means that the CNTW number of error free frames have been read since the last error was observed on the track such that it will now be possible to drop that pointer. Consequently, all bits in register 1 are reset to zero at step 81, and a branch is taken to call the rotate register routine at step 82. At that time, the pointer for this track is dropped as will be apparent when FIG. 15 is discussed later herein.

At step 80, if the count in the pointer off register is not yet zero, a branch is taken to step 83 where the pointer off count is decremented by one as is the count in the PLEN register. Thereafter, a branch is taken to step 79 for performance of those operations already discussed above. At step 84 the PLA 41 determines whether or not the process is currently in a resync decision frame. As discussed above, in a particular implementation, that may be frame 54. If a determination is that we are not in frame 54, a branch is taken to step 85 where a signal is raised on line 34 to enable a pointer to the decoder 22. If it is determined at step 84 that the process is currently processing the decision frame, that is, frame 54, then it must be determined at step 86 whether the PLEN count is greater than the resync threshold. If the count is greater than the resync threshold, that means that there has been too many errors on that track indicating that the track may be out of sync. In such case, the resync request bit is set at step 87. Again, the value in the PLEN counter represents the quality of the track currently being processed. The count is incremented each time a code pointer signal is encountered in a frame from that track and it is decremented each time a code pointer signal is not encountered.

Returning to step 75, if there had been no pointer established for the track, a determination is made at step 88 whether a code pointer is currently in existence. If there is none, then the situation is that the track has been good in the past and it is still good and, therefore, a return is made to step 59 on FIG. 6. However, if the code pointer is now raised, the PLA 41 at step 88 determines that a track which had been previously free of errors now has an error and, therefore, a new register must be made active. In the read-while-write operation, the maximum number of pointers that can be handled at any one time is two. Therefore, the first query at step 89 is whether or not register 2 is already active. If the active bit in register 2 is set, then two pointers are already present. In such case, at step 90, a query is asked is the active bit in register 4 set? If it is, no more can be done, and a branch is taken to return to step 59. If, however, the register 2 active bit had not been set, or if all four registers did not contain an active bit, then the next register, whether it be register 1, 2, 3, or 4, will receive an active pointer for the track currently being considered. Therefore, at step 91, the pointer off variable is set to the initializing count for a read-while-write operation, the PLEN register is set to one, the pointer location value is set to the location value, the ACTIVE bit and the CODEM bit will both be set to one, and the threshold bits, together with the RESYNC REQUEST bit will all be set to zero. Thereafter, a pointer is enabled to the decoder at step 85, the registers will be rotated at step 82, and a return made to step 59.

Note that even though the number of active pointers is limited to two in a read-while-write operation, registers 3 and 4 may become active to contain information on other frames which contain errors so that the information is available for error recovery procedures.

Figure 9:
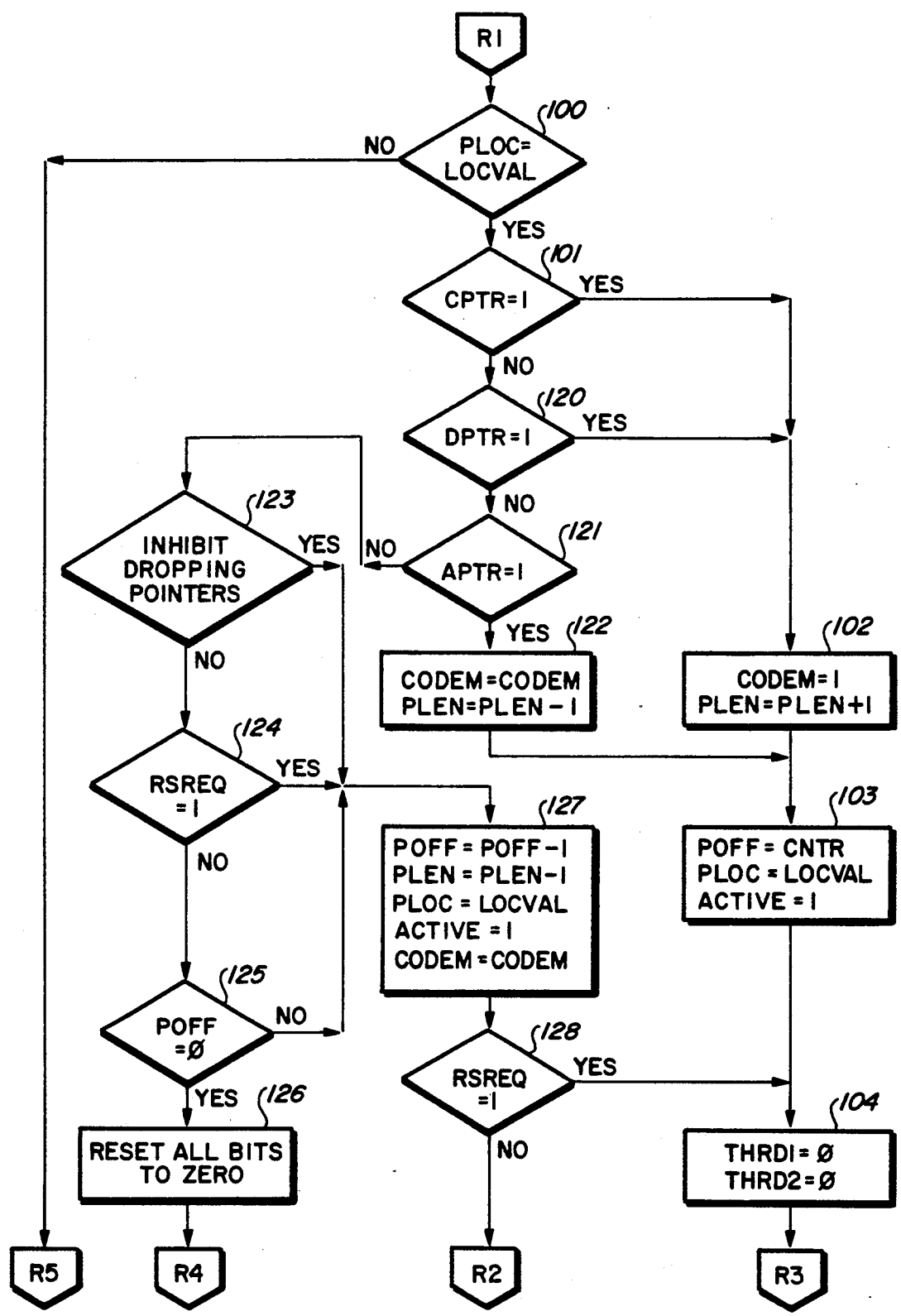
Figure 10:
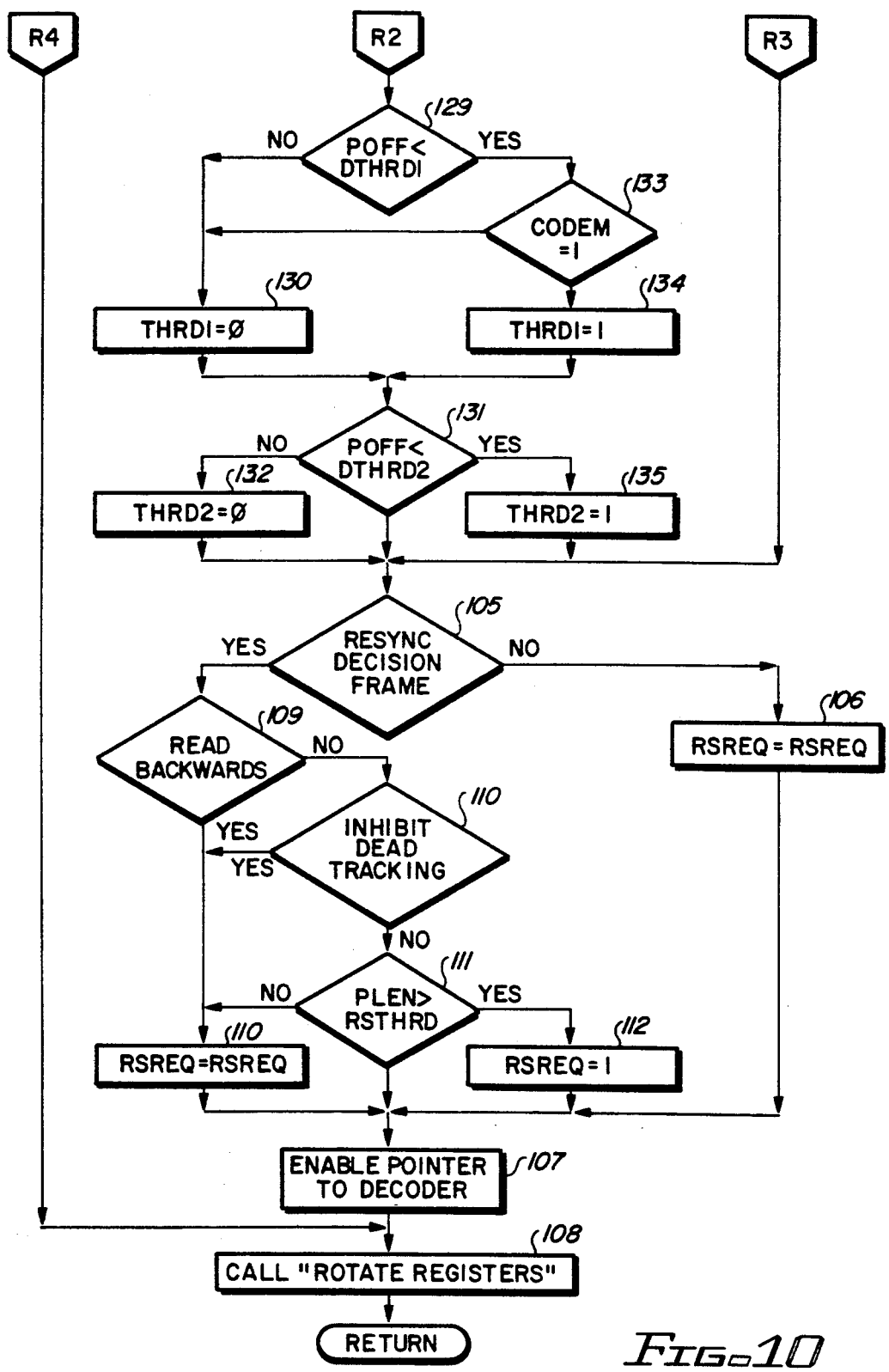

If a branch is made at step 64 on FIG. 6 to a read operation, the read only procedure begins on FIG. 9 at step 100. The first step is the determination of whether an active pointer is currently in existence for the track being processed by the error correction code module. If that initial determination is yes, the PLOC value will equal LOCVAL. The first query then at step 101 is whether the code pointer has been raised. If it is, at step 102, the code pointer control bit (CODEM) is set and the PLEN count in the PLEN portion of register 1 is incremented by one. At step 103, the count in the pointer off portion of register 1 is initialized to the appropriate count value (CNTR) for a read operation. Again, that value is programmable and is under the control of microprocessor 15. The dropping threshold bits are set to zero at step 104, and a branch is made to step 105 on FIG. 10. At step 105, it is determined whether the current frame is a resync decision frame, that is, frame 54. If it is not, the resync request bit is continued in its current state at step 106, and at step 107, the pointer is enabled to the error correction code module on line 34 to indicate to that module that an error continues to exist on the current track. Next, the rotate register procedure is called at step 108, and return is made to step 59. If it was determined at step 105 that the resync decision frame is currently being processed, then at step 109, the PLA 41 will determine whether error recovery procedures are currently in operation and, specifically, is the record being read backwards in an attempt to ascertain what is written on the tape. If a read backwards operation is in process, then the resync request flag is continued in its current state at step 110, the pointer signal continues to be enabled at step 107, the rotate registers routine is called, and a return made to step 59. If at step 109 there was no read backwards operation, then at step 110, it is determined whether or not dead tracking has been inhibited by the error recovery procedures. If it is not, then the query is made does the count in the PLEN portion of the register exceed the resync threshold? If it does, then there are too many errors on that track, and it should be dead tracked. In such case, the resync request flag is raised at step 112, and the process continues as previously described.

Returning now to step 101 on FIG. 9, suppose that no code pointer was present for the frame under consideration at step 101. In such case, a determination is made at step 120 weter a D pointer has been raised. If a D pointer is present, a branch is made to step 102 and the process continues as already described. If neither a C nor a D pointer are present, then the query is asked at step 121 as to whether an A pointer is present? If it is, the count in the PLEN register is decremented by one at step 122. Note that if a C or D pointer is present for the frame under consideration a real error is present in that frame and the PLEN counter is incremented as shown at step 102. However, if an analog pointer is present, the PLEN counter is decremented, as shown at step 122. This is because the A pointer does not always point to a real error. If it happens that there is a real error present, the code pointer will be raised when the error is corrected. The pointer off count (POFF) is reinitialized as shown at step 103 and the process continues as already described.

If at step 121, an A pointer was not present, that means there is no active pointer for the frame being considered even though the track from which it came does have an active pointer. In this case, a branch is made to step 123 to inquire whether the error recovery procedures have inhibited the dropping of pointers. If it has not, then the query is raised at step 124 whether the resynchronization request flag is set. If it is not, then the query at step 125 is whether the count in the pointer off register equals zero. If it does equal zero, then all bits in the register are set to zero at step 126 and the pointer is dropped. This occurs during the rotate registers routine at step 108. If, however, the error recovery procedures had inhibited the dropping of pointers, or if the resync request flag had been set, or if the count in the POFF register was not yet equal to zero, a branch is made to step 127 where the count in the POFF register is decremented by one, the count in the PLEN register is decremented by one, and the active bit is continued. If the resync request flag has been raised, a branch is made at step 128 to continue the processing as already described. If the resync request flag has not been raised, then a branch is made to step 129, on FIG. 10, for determination whether the count in the pointer off register is less than the first dropping threshold (DTHRD1). If it is not, then the threshold one bit (THRD1) is set to zero at step 130, and at step 131, a determination is made as to whether the count in the POFF register is less than the second dropping threshold (DTHRD2). If it is not, the threshold two bit (THRD2) is set to zero at step 132, and the processing continues as already described. If, at step 129, it was determined that the count in the POFF register was less than the first dropping threshold, then the query is asked as to whether a C or D pointer is currently raised. If either one is raised, then the threshold one bit is set equal to one, and the query is asked at step 131 whether the count in the pointer off register is less than the second dropping threshold. If it is, then the threshold two bit is set equal to one and the processing continues as already described.

In this portion of the procedure, a determination is made as to whether the decremented POFF count is less than a dropping threshold. If it is not, that pointer cannot be dropped. If, however, the count in the pointer off register has dropped below one of the two dropping thresholds, the pointer has become a stale pointer and is a candidate for being dropped. The dropping of a pointer will occur if the number of pointers exceeds the maximum number permitted, that is, four pointers.

If the error that had set the pointer was the result of either a code or demodulator pointer, then the threshold one bit is set. If the pointer had been the result of an analog pointer, then the count in the pointer off register must be less than the second dropping threshold before the second threshold bit will be set. This procedures shows a preference for dropping a stale pointer which is the result of an analog printer rather than a stale pointer which is the result of a C or D pointer. This preference is because a code or demodulator pointer points to real errors while an analog pointer may be false. Therefore, the threshold for dropping that type of pointer requires less error-free frames.

Figure 11:
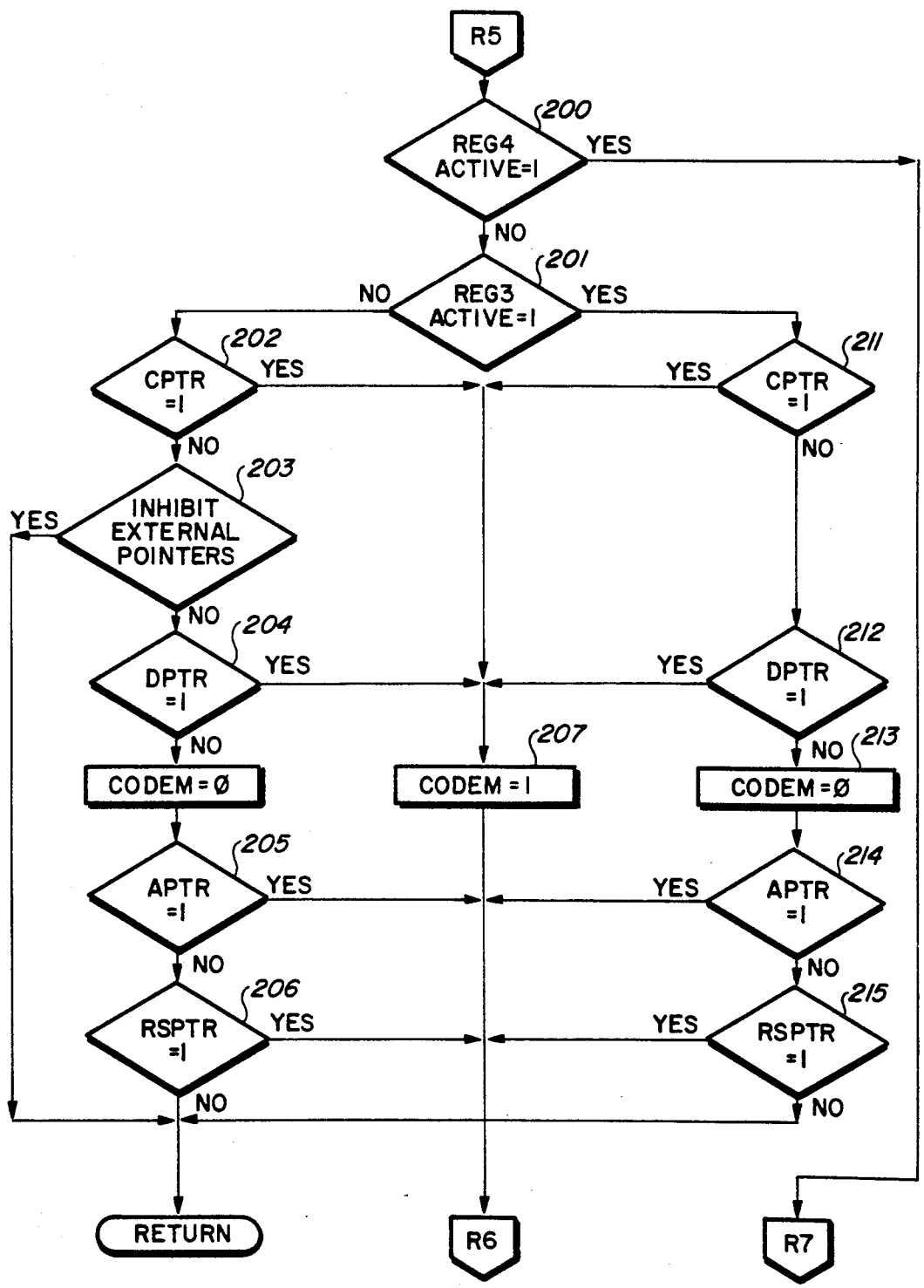

Returning to FIG. 9, suppose that the determination at step 100 is that there was no active pointer for the current track. In that case, a branch is taken to FIG. 11 at step 200, where it is determined whether register 4 is currently active? If it is not, then the query is asked at step 201, is register 3 currently active? If it is not, the query is asked at step 202, is a code pointer signal now present? If it is not, at step 203, the query is asked as to whether error recovery procedures have inhibited the external pointers, that is, the A pointer, the RS pointer, and the D pointer. If such pointers are inhibited, then a return is made to step 59 on FIG. 6 so that error recovery procedures continue. If external pointers have not been inhibited, then the query is asked at step 204, is the D pointer signal now present? If there is none, then the CODEM bit is set to zero, and the query is asked at step 205, is then an A pointer signal now present? If there is no A pointer and no RS pointer, as determined at step 206, then there is an error-free frame on an error-free track, and a return is made to step 59 on FIG. 6 for further processing.

Figure 12:
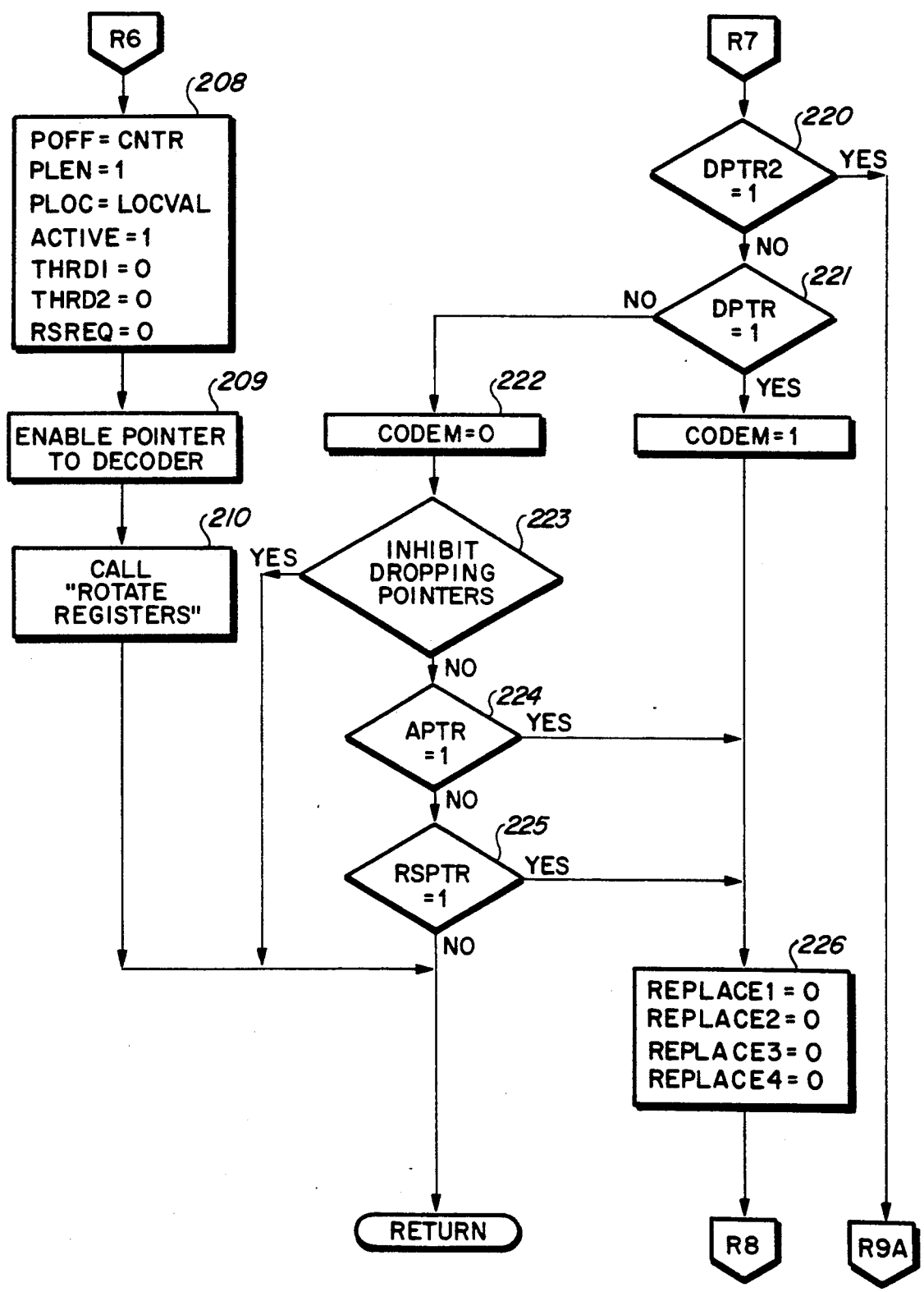

If a D pointer was found at step 204, the CODEM bit is set to one at step 207 and a branch is made to step 208 on FIG. 12. Also, if there is either an A pointer or an RS pointer for the frame under consideration, a branch is made to step 208. The situation is that this particular track has not previously had an error, but now has an error and register 3 is not active. Therefore, what will happen is that the next available register, either register one, two, or three will be made active, and the pointer off (POFF) portion of that register will be initialized, the PLEN portion of that register will be set equal to one, the pointer location value in that register will be set equal to the current track ID, the active bit will be set, and the various threshold flags will be initialized. At step 209, a pointer signal is enabled to the decoder and, at step 210, the rotate register routine is called.

If, at step 201, register 3 had been found to be active, and at step 211, if a code pointer is now present, a branch is made to step 207 to continue the procedure as already described. Similarly, if a D pointer is present, as found at step 212, the procedure will continue as previously described. If there is no C pointer or D pointer, then the CODEM bit is set to zero at step 213, and at steps 214 and 215, it is determined whether an A pointer or an RS pointer is present. If neither of those pointers is present, then the situation is an error-free frame on an error-free track and a return is made to step 59 on FIG. 6 for further processing. If either of these pointers is present, a branch is made to step 208 for processing the new pointer as previously described.

At step 200, if it is determined that four registers are currently active, then a branch is taken to step 220 on FIG. 12. At step 220, the query is asked as to whether a D pointer was active two frames ago and delayed? If it was not, at step 221 it is determined whether a D pointer is currently active. If it is not, then a branch is taken to set the CODEM bit to zero at step 222, and at step 223, it is determined whether error recovery procedures have inhibited the dropping of pointers. If they have, then return is made to step 59. If they have not, then the query is asked as to whether the A pointer signal is active or an RS pointer is active at steps 224 and 225. If neither of those pointers are active, then the situation is that there is an error-free frame and even though four pointers are currently active, there is no need to add any pointers and the return is made to step 59 for further processing. If, however, either a D pointer, an A pointer or an RS pointer are present, then the four replace bits, one for each register, are all set to zero at step 226, and a branch is taken to step 227 on FIG. 13.

On FIG. 4, threshold logic 44 and replace logic 45 are indicated as receiving inputs from a pointer register array and providing information back to the pointer control PLA 41.

Figure 13:
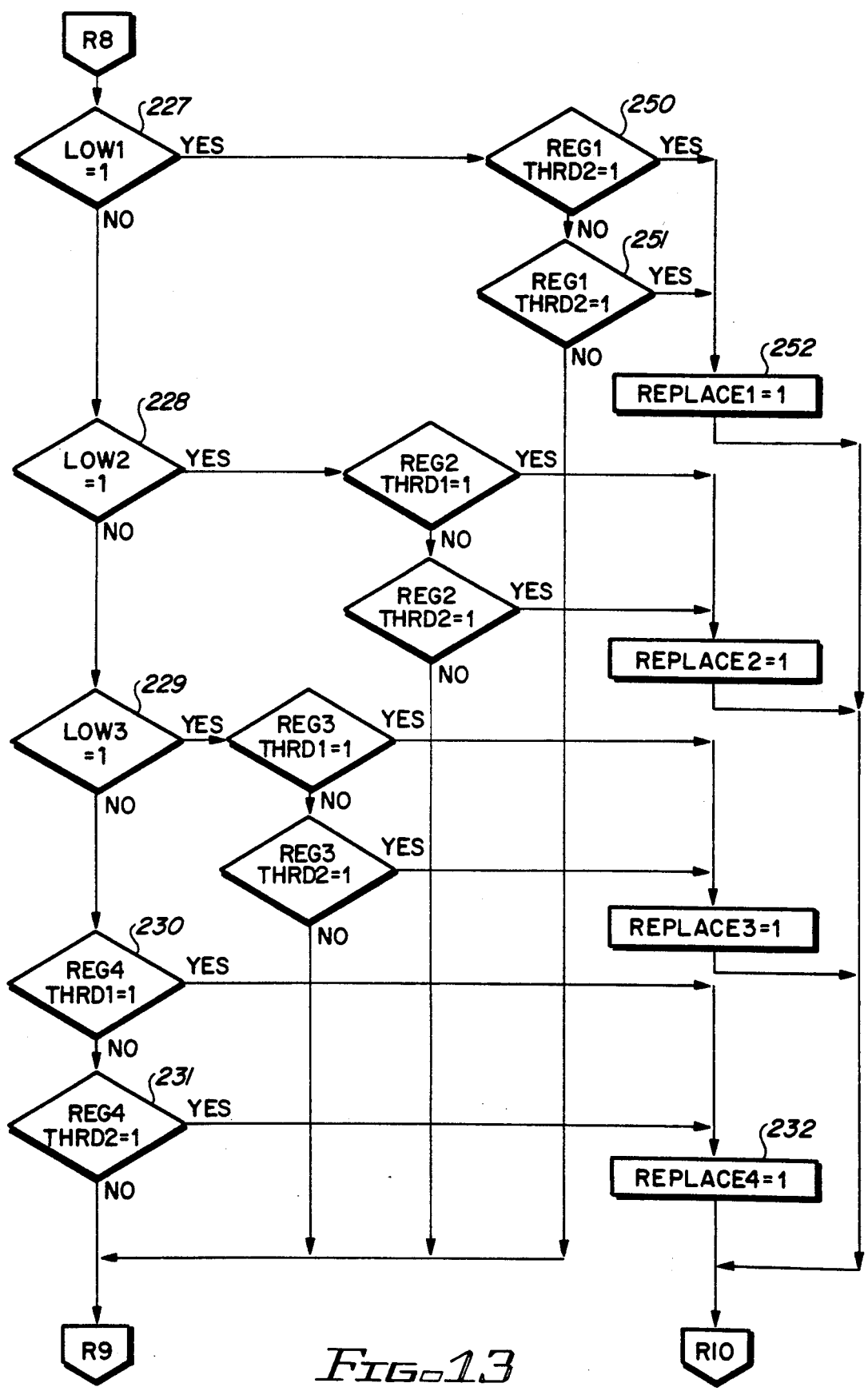

In FIG. 13, the operations performed in the logic circuits of FIG. 4 are described. At step 227 a query is made as to whether the pointer off count (POFF) in register 1 is the lowest of the four POFF counts present in the four pointer registers. If it is not, a determination is made at step 228 as to whether the pointer off count in register 2 is the lowest. If it is not, then a determination is made at step 229 as to whether the pointer off count in register 3 is the lowest. If it is not, then a branch is made to step 230 to determine whether the threshold one bit has been set in register 4. If it has not, then a branch is taken to step 231 to determine whether threshold bit 2 is set. If either the threshold one bit or the threshold two bit have been set, then a branch is taken to step 232 where the replace four bit is set and a further branch is taken to step 233 on FIG. 14 for setting new values in register four. What is occurring here is that the previous pointer in register 4 was a stale pointer and the new pointer which has just been found for the track under current consideration is going to be established. To do that, the pointer off (POFF) portion of register 4 is initialized, the PLEN register is set to zero, the current location value is placed into the pointer location, the active bit is set, the various threshold flags are set to zero, and the rotate register routine will be called at step 234.

If at steps 230 and 231 it was determined that the pointer off count had not dropped below either of the two thresholds, a branch is taken to step 235 on FIG. 14 where the delay pointer enable bit is set before a return is made. The purpose of a delay pointer enable bit is to retain the new pointer for up to two frames for a continuation of the process so that if one of the pointer off counts in the four registers drops below either one of the two thresholds during the next two frames, the new pointer can be established in that register and thus a multitrack error condition can be avoided.

Returning to FIG. 12, at step 220, a query was asked whether a D pointer bit had been set representing an error that occurred two frames ago (DPTR2). That bit is set if a delay pointer enable signal is present at the time the D pointer is discovered. In such a situation, the determination is that all four registers are occupied with active pointers, none of which are stale and therefore a pointer to a real error which needs correction is retained for a period of two frames before a multitrack error bit is set. There is enough time, due to the data delay buffer, to delay a pointer signal up to two frames and still provide an erasure signal to the ECC circuit in time to point to the data byte in error. That occurs when, at step 220, the DPTR2 setting is observed and a branch is taken to step 236 on FIG. 14 for setting the multitrack error bit.

At step 227 in FIG. 13, if it was determined that the POFF count in register 1 was the lowest, then if that count had been low enough to set either the threshold one bit or the threshold two bit, a branch is taken to step 252 where a bit is set indicating that the pointer in register 1 can be replaced. Thereafter, at step 233, the values in register 1 are initialized for the new pointer. Similar procedures take place if the count in registers 2 or 3 were the lowest, in which case, the pointer in those registers will be replaced if the POFF count had dropped below the threshold level.

The process performed by the rotate control logic 46 is outlined in FIG. 15. At several steps during the course of the procedures which have just been described, the rotate registers routine was called. Upon entry into this routine, the first query at step 260 is whether an active pointer is in existence for the current track being processed. If the answer is yes, a determination is made at step 261 as to whether register 4 is currently active. If it is not, a determination is made at step 262 as to whether register 3 is currently active. If it is not, a determination is made at step 263 as to whether register 2 is active. If it is not, then register 1 will receive the updated values which have been calculated in the procedures previously described as shown in step 264. The situation is that a track with a pointer still has an error in the current frame and the pointer is in register 1, therefore the contents of register 1 are updated. If register 2 was determined to be active at step 263, then the values in register 2 will be shifted into register 1 and the values in register 2 will be updated in accordance with the procedures just described, that is, a new pointer off (POFF) count, a new PLEN count, etc.

Similarly, if register 3 was found active at step 262, then the values in register 3 will be shifted into register 2, the values in register 2 will be shifted into register 1, and the values which have been calculated in the update procedures will be placed in register 3 at step 266. Finally, at step 261, if register 4 was found to be active, the registers will be shifted and the updating occur as shown at step 267.

If a determination is made at step 260 that the current track identification does not equal a pointer location in register 1, then it is known that a new track pointer is needed. A query is then made at step 270 whether register 4 is currently active. If it is not, then a branch is taken to step 271 to determine whether register 3 is currently active. If it is, then register 4 is updated with the new pointer information at step 272 and return is made for further processing. If register 3 is not active, then a determination is made as to whether register 2 is active at step 273. If it is, then register 3 is updated with the new pointer information at step 274 and a return is made for further processing. If register 2 is not active, then at step 275 it will be determined whether register 1 is active. If it is, then the new pointer information is placed in register 2 at step 276. If it is not, the new pointer information is placed in register 1 as shown at step 277. In either case, a return is made for further processing.

At step 270, if it was determined that register 4 is currently active, then a determination is made at step 278 whether the pointer information in register 1 is stale and can be replaced If it is, the contents of register 2 are shifted into register 1 at step 279, the contents of register 3 are shifted into register 2 at step 280, and the contents of register 4 are shifted into register 3 at step 281. Thereafter, the new pointer information is placed into register 4 at step 282, and a return is made for further processing. Similarly, if register 2 contained the lowest count, then the contents of register 3 would be shifted to register 2, the contents of register 4 would be shifted to register 3, and the new pointer information would be placed into register 4. In this instance, the contents of register 1 would not be shifted but the previous contents of register 2 will be dropped. If register 3 contained the lowest POFF count and it was low enough that the pointer information in register 3 could be dropped, then at step 284, the contents of register 4 would be shifted into register 3, as shown at step 281, and the new pointer information will be placed into register 4 at step 282. In this case, the previous contents of register 3 will be dropped, and the previous contents of registers 1 and 2 will remain without being moved. In this manner, the contents of register 4 always represent, upon completion of this routine, the pointer information for the track that has just been processed. In that manner, the correct order of tracks is maintained in the four registers regardless of which pointer is dropped.

To summarize the process implemented within the various pointer control circuits, it may be observed that FIG. 6 describes the mode selection, that is, reset mode, resync frame mode, read-while-write mode, and the read-only mode. During the reset mode, all registers are reset to the initial states, typically zero. When processing a resync frame, the circuits perform the process shown in FIG. 7. If there is no existing pointer (that is, PLOC does not equal LOCVAL), nothing is done. If there is an existing pointer and a resync had been requested and the resync character was detected, the resync request bit is reset to zero. Whenever there is a pointer for the location under consideration, the registers are rotated.

When in the read-while-write mode, the process shown in FIG. 8 is performed. This procedure uses only the code-generated pointer to activate a new pointer. When a code pointer is received, a pointer off variable (POFF) is set to whatever the initializing variable CNTW is. CNTW is a programmable value and is under microcode control. Each time it is determined that a pointer exists for the location for the track currently being considered and a code pointer is not active, the POFF count is decremented until zero and then the pointer is dropped from the pointer control registers. The variable PLEN, also maintained in the pointer control registers, is incremented on each occurrence of a code pointer and decremented on each frame for which there is no code pointer. If the PLEN count exceeds the resync threshold value at the resync decision frame, a resync request is enabled.

When in the read mode, the process shown in FIGS. 9 through 14 is performed. This procedure uses all of the pointer inputs. The read mode provides for early turn off of an existing pointer when the pointer control registers are at the maximum pointer capacity and a new pointer becomes active. This is accomplished through testing the status bits, threshold one (THRD1) and threshold two (THRD2) and the select lowest bits as shown in FIG. 13.

Figure 14:
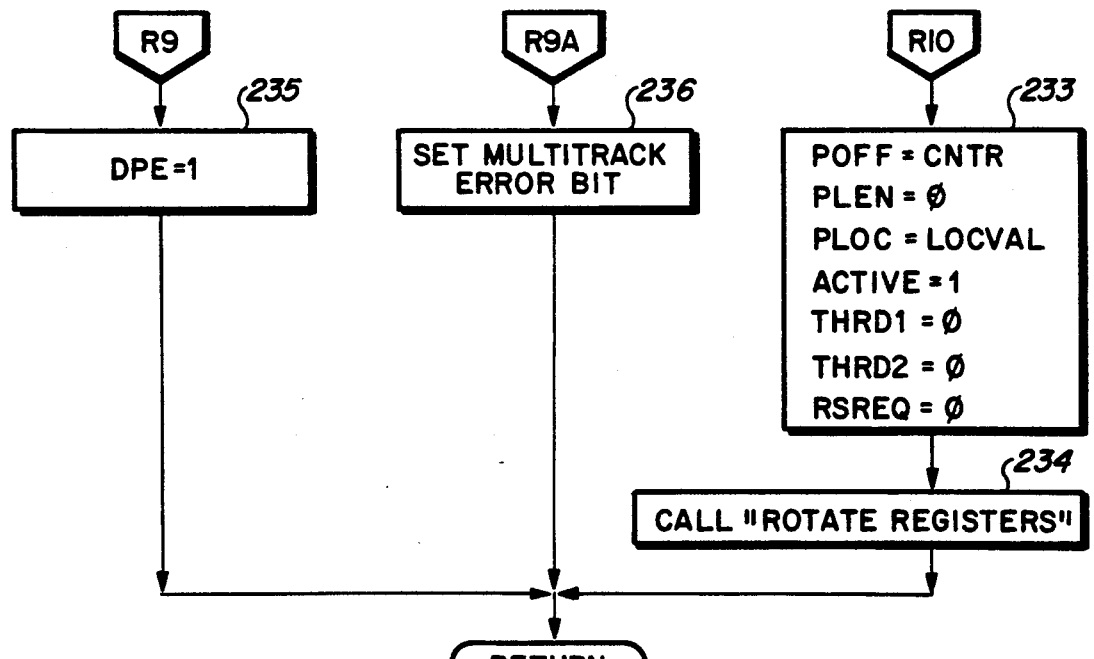
FIGS. 9 through 14 describe the control technique for processing erasure generation during a read procedure.

The rotate register process is shown in FIG. 14. The process supports register rotation whether it is a normal rotation without adding or deleting pointers or whether it is adding a new pointer without replacing an existing pointer or, finally, in the case of adding a new pointer and deleting an existing pointer.

Pointer control, as described above, offers significant improvements in performance over prior procedures. The thresholding logic described allows increased granularity in dropping decisions for pointers. By providing programmable pointer parameters, the system can be optimized to improve reliability. The rotating register implementation provides centralized pointer processing logic to minimize circuit count.

It will be observed that the pointer control circuits receive new pointer information, that is, the analog printer, the demodulator pointer and the code pointer on each track/byte boundary, and receives the resync pointer on each resync boundary. In addition, the location value and various control bits are also received in the pointer control circuits. These circuits process the input signals and output an erasure pointer to the ECC decoder to indicate a track in error, and outputs a resync request signal that forces a resync operation on the indicated track and, finally, issues a multitrack error message whenever the criteria is exceeded on a read-while-write operation and whenever an uncorrectable error condition exists on a read operation.

The pointer control circuits receive five programmable values from interface registers which are set by microcode. This includes the CNTW, which is the initial pointer off constant used during read-while-write operations; the CNTR value which is the initial pointer off constant used during read-only operations; the dropping threshold one (DTHRD1) count which is the pointer dropping threshold for code and demodulator pointers. If the pointer off count is less than this value for a particular track and that track pointer was set by a code or demodulator pointer, that track becomes a candidate for dropping if the capacity of the pointer register system is exceeded; DTHRD2 is the pointer dropping threshold for analog pointers. If the pointer off count is less than this value for a particular track and that track pointer was set by an analog pointer, that track becomes a candidate for dropping if the capacity of the pointer register system is exceeded; and the resync enable threshold (RSTHRD). If the PLEN error count for this track is greater than RSTHRD value at decision time, a resync operation will be initiated on this track.

Typically, it is desirable to program the value of CNTW some amount larger than CNTR so that pointers are extended longer on a write operation to stress the ECC system, thus leaving margin for future read operations. In this manner, write temporary error frequency will increase as CNTW is increased which has the effect of introducing more margin on read-only operations and thus reducing the read temporary error frequency. Besides the relative values of CNTW and CNTR, the optimum nominal absolute values of these variables depend on the error characteristics for a particular head/media/channel system. Therefore, having these values as programmed parameters allows optimization of their nominal values after empirical data and error measurements are made. Finally, these values, since they are programmable, may be dynamically altered during recovery actions and a reread attempted of the failing record. This will improve read recovery because nominal settings of these values will not be optimum for all error types. Thus, a dynamic stepping of these values during subsequent rereads will present optimum value for a particular error type and allow correction of some previously uncorrectable records.

Similarly, with DTHRD1, DTHRD2, and RSTHRD, optimum nominal values may be determined through system reliability testing, while dynamic changes to these values during recovery actions will reduce permanent read error rates.

Another feature of the pointer control is the use of two pointer dropping thresholds, DTHRD1 and DTHRD2. This feature improves read/write reliability by setting one dropping threshold (DTHRD1) for pointers set by code or demodulator pointers while having a separate dropping threshold (DTHRD2) for pointers set by analog pointers. Because code and demodulator pointers are 100-percent true pointers, that is, an error always has occurred when these pointers are active, it is desirable to have a more stringent requirement for dropping the pointer, that is, to have more pointer-free data frames after the initiating error event before this pointer is a candidate for dropping.

Analog pointers, on the other hand, have a high false pointer rate (a pointer when no error occurred). Therefore, it is desirable to make these pointers candidates for dropping after fewer pointer-free frames following the initial pointer. This feature has the net effect of reducing false erasure pointers to the ECC which improves the correction ability of the ECC for other erasures of errors which may be active.

Another feature is the use of a "rotating register" circuit to cut circuit count in the pointer control. In a more straight-forward implementation, for each pointer register there is a PLEN up/down counter that increments if an incoming pointer is active for that track, or decrements if an incoming pointer is not active. In the pointer control of this invention, however, only one track PLEN counter is used at any given time. Therefore, only one PLEN incrementing/decrementing circuit is used with the input and output attached to the selected track during that track processing time. If four active pointer registers are required, for example, the more straight-forward approach would produce four up/down counters while the inventive scheme produces four registers and a single increment/decrement circuit. By applying this implementation to all the variables which must be incremented, decremented, cleared, set, or otherwise altered, a significant logic savings results. It also simplifies the design by having a single control function with the rotating set of storage registers.

What is claimed is:

1. Pointer control logic apparatus including registers for holding pointer parameters, said logic apparatus for generating erasure signals for use in error correcting code (ECC) circuits comprising:

microprocessor means connected to all other means in said pointer control logic apparatus for supervising said pointer control logic;

mode selection means for signalling entry into a read-while-write mode wherein data just written to a storage medium is read to ascertain that it was written successfully;

comparison means connected to said mode selection means for comparing the location value (PLOC) in already loaded pointer registers to the location value (LOCVAL) of data currently in process in said ECC circuits;

signal generation means for supplying pointer signals when data for said LOCVAL is in error;

first processing means connected to said comparison means and to said signal generation means for designating a pointer register for said LOCVAL in the case where no already loaded pointer register was found to correspond to said LOCVAL by said comparison means, said first processing means also including means for loading an initializing count (CNTW) into a "pointer off" circuit (POFF) located in the LOCVAL pointer register, said initializing count being a programmable value under the control of said microprocessor means;

second processing means connected to said LOCVAL register for decrementing the count in said POFF circuit each time said location value contains an error free data byte until said count equals zero, in which case said LOCVAL pointer register is dropped; and third processing means for resetting said count in said POFF circuit to its initial value, CNTW, whenever said location value contains a data byte in error.

2. The pointer control logic of claim 1 further including:

said mode selection means for signalling entry into a read-only mode wherein previously stored data is read;

said comparison means connected to said mode selection means for comparing the location value (PLOC) in already loaded pointer registers to the location value (LOCVAL) of data currently in process in said ECC circuits;

signal generation means for supplying pointer signals when data for said LOCVAL is in error;

fourth processing means connected to said comparison means and to said signal generation means, for designating a pointer register for said LOCVAL in the case where no already loaded pointer register was found to correspond to said LOCVAL by said comparison means, said fourth processing means also including means for loading an initializing count, CNTR, into a pointer off circuit (POFF) located in the LOCVAL pointer register, said initializing count being a programmable value under the control of said microprocessor means;

fifth processing means connected to said register for decrementing the count in said POFF circuit each time said LOCVAL contains an error free data byte, until said count equals zero in which case said LOCVAL pointer register is dropped; and wherein said microprocessor means programs said CNTR value used for said read-only mode to a lower value than said CNTW value used in said read-while-write mode so that pointers are maintained for a greater number of error free bytes during read-while-write mode than for read-only mode.

3. Pointer control logic apparatus including registers for holding pointer parameters for generating erasure signals for use in error correcting code (ECC) circuits comprising:

microprocessor means connected to all other means in said pointer control logic apparatus for supervising said pointer control logic;

mode selection means for signalling entry into a read-only mode wherein previously stored data is read;

comparison means connected to said mode selection means for comparing the location value (PLOC) in already loaded pointer registers to the location value (LOCVAL) of data currently in process in said ECC circuits;

signal generation means for supplying pointer signals when data for said LOCVAL is in error;

first processing means connected to said comparison means and to said signal generation means for designating a pointer register for said LOCVAL in the case where no already loaded pointer register was found by said comparison means, said first processing means including means for loading an initial count (CNTR) into a "pointer off" (POFF) circuit located in the LOCVAL register, said initial count being a programmable value under the control of said microprocessor means;

second processing means for decrementing the count in said POFF circuit each time said LOCVAL contains an error free data byte, until said count equals zero, in which case said LOCVAL pointer register is dropped; and third processing means for resetting said count in said POFF circuit to its initial value, CNTR, whenever said LOCVAL contains a data byte in error.

4. The pointer control logic of claim 3 further including:

means connected to said POFF circuit for setting a first pointer dropping threshold value at a POFF count between CNTR and zero, said first threshold value being a programmable value under the control of said microprocessor means;

fourth processing means connected to said POFF circuit, including comparator means for determining the lowest POFF count among the already loaded (active) pointer registers, and further comparator means for determining whether said lowest POFF count is below said first threshold value, said fourth processing means further including means for replacing the contents of the active pointer register with the lowest POFF count with new contents for the LOCVAL when said lowest POFF count is below said first threshold value and when the maximum number of active pointer registers are loaded and a LOCVAL not pointed to by an active register contains a data byte in error.

5. The pointer control logic of claim 4 further including:

means connected to said POFF circuit for setting a second pointer dropping threshold value at a POFF count between said CNTR and said first threshold value, said second threshold value being a programmable value under the control of said microprocessor means;

said fourth processing means further including comparator means for determining whether said lowest POFF count is below said second threshold value, said fourth processing means further including means for replacing the contents of the active pointer register with the lowest POFF count with new contents for the LOCVAL, when said lowest POFF count is below said second threshold value but not below said first threshold value and when the maximum number of active pointer registers are loaded and a LOCVAL not pointed to by an active register contains a data byte in error.

6. The pointer control logic of claim 5 wherein said fourth processing means further includes:

flag means for associating said second threshold value with pointers that are derived from a first class of data byte pointers that can point to potential errors.

7. The pointer control logic of claim 4 further including:

n register means connected to all of said processing means and comparator means for holding pointer parameters including the POFF count and all other values and flags associated with the pointer, one register for each pointer, n equal to the maximum number of pointers for which said ECC circuits can correct errors;

a first register means among said n register means, connected to said processing circuits for holding the pointer parameters, if any, corresponding to the location value (LOCVAL) of data currently in process in said ECC circuits;

means connected to said n register means for shifting the contents of all active registers to shift the contents of said first register means to another register means upon processing said LOCVAL when more than one pointer register is active;

means for loading said first register means upon a shift operation with pointer parameters from a second register means so that said first register means contains parameters for the next location value with an active pointer no matter how many of n pointer registers are loaded; and means for incrementing/decrementing operations for all pointer parameters when they are in said first register means;

whereby the number of active registers expands and contracts with the number of active pointers to provide a variable circle of registers in which the contents are shifted one to another upon each shift operation.

8. The pointer control logic of claim 7 wherein the register whose contents are to be replaced is designated n-a where "a" can take a value from 0 to n−1, and wherein said means for replacing further includes:

means for deleting the contents of register n-a;

means for activating said means for shifting to move the contents of all registers with a designation greater than n-a into the next lower designated register, thereby deleting pointer parameters from register n; and means for loading register n with pointer parameters for said LOCVAL;

whereby the order of pointers in said registers is preserved and said first register means continues to contain pointer parameters, if any, to the next location value.

9. The pointer control logic of claim 5 further including:

n register means connected to all of said processing means and comparator means for holding pointer parameters including the POFF count and all other values and flags associated with the pointer, one register for each pointer, n equal to the maximum number of pointers for which said ECC circuits can correct errors;

a first register means among said n register means, connected to said processing circuits for holding the pointer parameters, if any, corresponding to the location value (LOCVAL) of data currently in process in said ECC circuits;

means connected to said n register means for shifting the contents of all active registers to shift the contents of said first register means to another register means upon processing said LOCVAL when more than one pointer register is active;

means for loading said first register means upon a shift operation with pointer parameters from a second register means so that said first register means contains parameters for the next location value with an active pointer no matter how many of n pointer registers are loaded; and means for incrementing/decrementing operations for all pointer parameters when they are in said first register means;

whereby the number of active registers expands and contracts with the number of active pointers to provide a variable circle of registers in which the contents are shifted one to another upon each shift operation.

10. The pointer control logic of claim 9 wherein the register whose contents are to be replaced is designated n-a where "a" can take a value from 0 to n−1, and wherein said means for replacing further includes:

means for deleting the contents of register n-a;

means for activating said means for shifting to move the contents of all registers with a designation greater than n-a into the next lower designated register, thereby deleting pointer parameters from register n; and means for loading register n with pointer parameters for said LOCVAL;

whereby the order of pointers in said registers is preserved and said first register means continues to contain pointer parameters, if any, to the next location value.

11. The pointer control logic of claim 1 further including:

n register means connected to all of said processing means and comparator means for holding pointer parameters including the POFF count and all other values and flags associated with the pointer, one register for each pointer, n equal to the maximum number of pointers for which said ECC circuits can correct errors;

a first register means among said n register means, connected to said processing circuits for holding the pointer parameters, if any, corresponding to the location value (LOCVAL) of data currently in process in said ECC circuits;

means connected to said n register means for shifting the contents of all active registers to shift the contents of said first register means to another register means upon processing said LOCVAL when more than one pointer register is active;

means for loading said first register means upon a shift operation with pointer parameters from a second register means so that said first register means contains parameters for the next location value with an active pointer no matter how many of n pointer registers are loaded; and means for incrementing/decrementing operations for all pointer parameters when they are in said first register means;

whereby the number of active registers expands and contracts with the number of active pointers to provide a variable circle of registers in which the contents are shifted one to another upon each shift operation.

12. The pointer control logic of claim 3 further including:

n register means connected to all of said processing means and comparator means for holding pointer parameters including the POFF count and all other values and flags associated with the pointer, one register for each pointer, n equal to the maximum number of pointers for which said ECC circuits can correct errors;

a first register means among said n register means, connected to said processing circuits for holding the pointer parameters, if any, corresponding to the location value (LOCVAL) of data currently in process in said ECC circuits;

means connected to said n register means for shifting the contents of all active registers to shift the contents of said first register means to another register means upon processing said LOCVAL when more than one pointer register is active;

means for loading said first register means upon a shift operation with pointer parameters from a second register means so that said first register means contains parameters for the next location value with an active pointer no matter how many of n pointer registers are loaded; and means for incrementing/decrementing operations for all pointer parameters when they are in said first register means;

whereby the number of active registers expands and contracts with the number of active pointers to provide a variable circle of registers in which the contents are shifted one to another upon each shift operation.

13. The pointer control logic of claim 4 further including:
means connected to said signal generation means and to said fourth processing means for activating said pointer signals for more than one data byte for said LOCVAL when the maximum number of active pointer registers are loaded, and a LOCVAL not pointed to by an active register contains a data byte in error, and said lowest POFF count is above said first threshold value.

14. The pointer control logic of claim 5 further including:
means connected to said signal generation means and to said fourth processing means for activating said pointer signals for more than one data byte for said LOCVAL when the maximum number of active pointer registers are loaded, and a LOCVAL not pointed to by an active register contains a data byte in error, and said lowest POFF count is above said first threshold value and said second threshold value.

15. A method of pointer control for generating erasure signals for use in error correcting code (ECC) circuits including the steps of:
signalling entry into a read-while-write mode wherein data just written to a storage medium is read to ascertain that it was written successfully;
comparing the location value (PLOC) in already loaded pointer registers, if any, to the location value (LOCVAL) of data currently in process in said ECC circuits;
supplying pointer signals when data for said LOCVAL is in error;
designating a pointer register for said LOCVAL in the case where no already loaded pointer register was found to correspond to said LOCVAL;
loading an initializing count (CNTW) into a "pointer off" circuit (POFF) located in the LOCVAL pointer register, said initializing count being a programmable value;
decrementing the count in said POFF circuit each time said location value contains an error free data byte until said count equals zero, in which case said LOCVAL pointer register is dropped; and
resetting said count in said POFF circuit to its initial value, CNTW, whenever said location value contains a data byte in error.

16. The pointer control method of claim 15 further including the steps of:
signalling entry into a read-only mode wherein previously stored data is read;
comparing the location value (PLOC) in already loaded pointer registers, if any, to the location value (LOCVAL) of data currently in process in said ECC circuits;
supplying pointer signals when data for said LOCVAL is in error;
designating a pointer register for said LOCVAL in the case where no already loaded pointer register was found to correspond to said LOCVAL;
loading an initializing count, CNTR, into a pointer off circuit (POFF) located in the LOCVAL pointer register, said initalizing count being a programmable value;
decrementing the count in said POFF circuit each time said LOCVAL contains an error free data byte, until said count equals zero in which case said LOCVAL pointer register is dropped; and
setting said CNTR value used for said read-only mode to a lower value than said CNTW value used in said read-while-write mode so that pointers are maintained for a greater number of error free bytes during read-while-write mode than for read-only mode.

17. A method of pointer control for generating erasure signals for use in error correcting code (ECC) circuits including the steps of:
signalling entry into a read-only mode wherein previously stored data is read;
comparing the location value (PLOC) in already loaded pointer registers to the location value (LOCVAL) of data currently in process in said ECC circuits;
supplying pointer signals when data for said LOCVAL is in error;
designating a pointer register for said LOCVAL in the case where no already loaded pointer register was found;
loading an initial count (CNTR) into a "pointer off" (POFF) circuit located in the LOCVAL register, said initial count being a programmable value;
decrementing the count in said POFF circuit each time said LOCVAL contains an error free data byte, until said count equals zero, in which case said LOCVAL pointer register is dropped; and
resetting said count in said POFF circuit to its initial value, CNTR, whenever said LOCVAL contains a data byte in error.

18. The pointer control method of claim 17 further including the steps of:
setting a first pointer dropping threshold value at a POFF count between CNTR and zero, said first threshold value being a programmable value;
determining the lowest POFF count among the already loaded (active) pointer registers;
determining whether said lowest POFF count is below said first threshold value;
replacing the contents of the active pointer register with the lowest POFF count with new contents for the LOCVAL when said lowest POFF count is below said first threshold value and when the maximum number of active pointer registers are loaded and a LOCVAL not pointed to by an active register contains a data byte in error.

19. The pointer control method of claim 18 further including the steps of:
setting a second pointer dropping threshold value at a POFF count between said CNTR and said first threshold value, said second threshold value being a programmable value;
determining whether said lowest POFF count is below said second threshold value;
replacing the contents of the active pointer register with the lowest POFF count with new contents for the LOCVAL, when said lowest POFF count is below said second threshold value but not below said first threshold value and when the maximum number of active pointer registers are loaded and a LOCVAL not pointed to by an active register contains a data byte in error.

20. The pointer control method of claim 19 further including the steps of:
   associating said second threshold value with pointers that are derived from a first class of data byte pointers that can point to potential errors.

21. The pointer control method of claim 18 further including the steps of:
   holding pointer parameters including the POFF count and all other values and flags associated with the pointer in n registers, one register for each pointer, n equal to the maximum number of pointers for which said ECC circuits can correct errors;
   holding the pointer parameters, if any, corresponding to the location value (LOCVAL) of data currently in process in said ECC circuits in a first register;
   shifting the contents of all active registers to shift the contents of said first register upon processing said LOCVAL when more than one pointer register is active;
   loading said first register upon a shift operation with pointer parameters from a second register so that said first register contains parameters for the next location value with an active pointer, no matter how many of n pointer registers are loaded; and
   incrementing/decrementing all pointer parameters when they are in said first register;
   whereby the number of active registers expands and contracts with the number of active pointers to provide a variable circle of registers in which the contents are shifted one to another upon each shift operation.

22. The pointer control method of claim 21 wherein the register whose contents are to be replaced is designated n-a where "a" can take a value from 0 to n−1, and wherein said step of replacing further includes the steps of:
   deleting the contents of register n-a;
   activating said shifting step to move the contents of all registers with a designation greater than n-a into the next lower designated register, thereby deleting pointer parameters from register n; and
   loading register n with pointer paramters for said LOCVAL;
   whereby the order of pointers in said registers is preserved and said first register continues to contain pointer parameters, if any, to the next location value.

23. The pointer control method of claim 19 further including the steps of:
   holding pointer parameters including the POFF count and all other values and flags associated with the pointer in n registers, one register for each pointer, n equal to the maximum number of pointers for which said ECC circuits can correct errors;
   holding the pointer parameters, if any, corresponding to the location value (LOCVAL) of data currently in process in said ECC circuits in a first register;
   shifting the contents of all active registers to shift the contents of said first register to another register upon processing said LOCVAL when more than one pointer register is active;
   loading said first register upon a shift operation with pointer parameters from a second register so that said first register contains parameters for the next location value with an active pointer, no matter how many of n pointer registers are loaded; and
   incrementing/decrementing all pointer parameters when they are in said first register;
   whereby the number of active registers expands and contracts with the number of active pointers to provide a variable circle of registers in which the contents are shifted one to another upon each shift operation.

24. The pointer control method of claim 23 wherein the register whose contents are to be replaced is designated n-a where "a" can take a value from 0 to n−1, and wherein said step of replacing further includes:
   deleting the contents of register n-a;
   activating said shifting step to move the contents of all registers with a designation greater than n-a into the next lower designated register, thereby deleting pointer parameters from register n; and
   loading register n with pointer parameters for said LOCVAL;
   whereby the order of pointers in said registers is preserved and said first register means continues to contain pointer parameters, if any, to the next location value.

25. The pointer control method of claim 15 further including the steps of:
   holding pointer parameters including the POFF count and all other values and flags associated with the pointer in n register, one register for each pointer, n equal to the maximum number of pointers for which said ECC circuits can correct errors;
   holding the pointer parameters, if any, corresponding to the location value (LOCVAL) of data currently in process in said ECC circuits in a first register;
   shifting the contents of all active registers to shift the contents of said first register means to another register upon processing said LOCVAL when more than one pointer register is active;
   loading said first register upon a shift operation with pointer parameters from a second register so that said first register contains parameters for the next location value with an active pointer no matter how many of n pointer registers are loaded; and
   incrementing/decrementing all pointer parameters when they are in said first register;
   whereby the number of active registers expands and contracts with the number of active pointers to provide a variable circle of registers in which the contents are shifted one to another upon each shift operation.

26. The pointer control method of claim 17 further including the steps of:
   holding pointer parameters including the POFF count and all other values and flags associated with the pointer in n register, one register for each pointer, n equal to the maximum number of pointers for which said ECC circuits can correct errors;
   holding the pointer parameters, if any, corresponding to the location value (LOCVAL) of data currently in process in said ECC circuits in a first register;
   shifting the contents of all active registers to shift the contents of said first register upon processing said LOCVAL when more than one pointer register is active;
   loading said first register upon a shift operation with pointer parameters from a second register so that said first register contains parameters for the next location value with an active pointer, no matter how many of n pointer registers are loaded; and
   incrementing/decrementing all pointer parameters when they are in said first register;

whereby the number of active registers expands and contracts with the number of active pointers to provide a variable circle of registers in which the contents are shifted one to another upon each shift operation.

27. The pointer control method of claim 18 further including the steps of:

activating said pointer signals for more than one data byte for said LOCVAL when the maximum number of active pointer registers are loaded, and a LOCVAL not pointed to by an active register contains a data byte in error, and said lowest POFF count is above said first threshold value.

28. The pointer control method of claim 19 further including the steps of:

activating said pointer signals for more than one data byte for said LOCVAL when the maximum number of active pointer registers are loaded, and a LOCVAL not pointed to by an active register contains a data byte in error, and said lowest POFF count is above said first threshold value and said second threshold value.

* * * * *